(12) United States Patent
Shang et al.

(10) Patent No.: US 12,471,464 B2
(45) Date of Patent: Nov. 11, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Biao Liu, Beijing (CN); Yixuan Long, Beijing (CN); Jiaxing Chen, Beijing (CN); Zuoji Niu, Beijing (CN); Chang Luo, Beijing (CN); Yi Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/025,915

(22) PCT Filed: Mar. 30, 2022

(86) PCT No.: PCT/CN2022/084060
§ 371 (c)(1),
(2) Date: Mar. 13, 2023

(87) PCT Pub. No.: WO2023/184235
PCT Pub. Date: Oct. 5, 2023

(65) Prior Publication Data
US 2024/0292687 A1    Aug. 29, 2024

(51) Int. Cl.
*H10K 59/131*  (2023.01)
*H10K 59/121*  (2023.01)
*H10K 59/35*   (2023.01)

(52) U.S. Cl.
CPC ......... *H10K 59/131* (2023.02); *H10K 59/351* (2023.02)

(58) Field of Classification Search
CPC . H10K 59/131; H10K 59/351; H10K 59/1216
See application file for complete search history.

(56) References Cited

U.S. PATENT DOCUMENTS

| | | | |
|---|---|---|---|
| 2008/0079001 A1* | 4/2008 | Umezaki | G02F 1/1368 257/E27.111 |
| 2008/0136990 A1* | 6/2008 | Kimura | G02F 1/1362 349/114 |

(Continued)

FOREIGN PATENT DOCUMENTS

| | | |
|---|---|---|
| CN | 109713022 A | 5/2019 |
| CN | 110416270 A | 11/2019 |

(Continued)

*Primary Examiner* — Mohsen Ahmadi
(74) *Attorney, Agent, or Firm* — Ling Wu; Stephen Yang; Ling and Yang Intellectual Property

(57) ABSTRACT

A display substrate and a display apparatus are provided, wherein the display substrate includes: a base substrate and a drive structure layer provided on the base substrate, the drive structure layer includes pixel circuits arranged in an array, the pixel circuits arranged in an array includes a plurality of power supply lines; the pixel circuit further includes a capacitor, the capacitor includes a first electrode plate and a second electrode plate; the plurality of power supply lines include a plurality of first power connection lines disposed in a first conductive layer and a plurality of second power connection lines disposed in a second conductive layer, the second conductive layer is located on a side of the first conductive layer away from the base substrate, the first power connection line and the second power connection line extend in a first direction.

20 Claims, 27 Drawing Sheets

(56) References Cited

U.S. PATENT DOCUMENTS

| | | | |
|---|---|---|---|
| 2009/0002586 A1* | 1/2009 | Kimura | G09G 3/3659 |
| | | | 349/39 |
| 2015/0243720 A1* | 8/2015 | Kwon | H10D 86/421 |
| | | | 257/40 |
| 2017/0076667 A1* | 3/2017 | Numata | G09G 3/3266 |
| 2018/0061908 A1* | 3/2018 | Shim | H10K 59/1213 |
| 2018/0158887 A1* | 6/2018 | Yun | H10K 50/805 |
| 2018/0233546 A1* | 8/2018 | Chu | H10K 59/122 |
| 2021/0036089 A1 | 2/2021 | Li et al. | |
| 2021/0225983 A1 | 7/2021 | Wu | |
| 2021/0240963 A1 | 8/2021 | Nakamura et al. | |
| 2022/0149334 A1* | 5/2022 | Liu | H10K 59/879 |
| 2022/0293707 A1 | 9/2022 | Zhou et al. | |
| 2022/0328579 A1 | 10/2022 | Shang et al. | |
| 2022/0328596 A1 | 10/2022 | Li | |
| 2022/0415259 A1* | 12/2022 | Qing | G09G 3/3241 |
| 2023/0144932 A1 | 5/2023 | Zhao et al. | |

FOREIGN PATENT DOCUMENTS

| | | |
|---|---|---|
| CN | 112582382 A | 3/2021 |
| CN | 112951892 A | 6/2021 |
| CN | 113056828 A | 6/2021 |
| CN | 113078174 A | 7/2021 |
| CN | 113471249 A | 10/2021 |
| CN | 113471265 A | 10/2021 |
| CN | 113692649 A | 11/2021 |
| CN | 113707704 A | 11/2021 |
| CN | 113745272 A | 12/2021 |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/084060 having an international filing date of Mar. 30, 2022. The above-identified application is hereby incorporated by reference.

TECHNICAL FIELD

The present disclosure relates to, but is not limited to, the field of display technology, and more particularly, to a display substrate and a display apparatus.

BACKGROUND

An Organic Light Emitting Diode (OLED for short) and a Quantum-dot Light Emitting Diode (QLED for short) are active light emitting display devices and have advantages such as self-luminescence, wide viewing angle, high contrast ratio, low power consumption, extremely high response speed, lightness and thinness, flexibility, and low costs. With the continuous development of display technologies, flexible displays that use OLEDs or QLEDs as light emitting elements and control signals by thin film transistors (TFTs) have become mainstream products in the field of display at present.

SUMMARY

The following is a summary of subject matter described herein in detail. The summary is not intended to limit the protection scope of claims.

In a first aspect, the present disclosure provides a display substrate including: a base substrate and a drive structure layer disposed on the base substrate, the drive structure layer includes pixel circuits arranged in an array, each pixel circuit of the pixel circuits arranged in an array include a plurality of power supply lines, the power supply line is configured to provide a power supply signal; the pixel circuit further includes a capacitor, the capacitor includes a first electrode plate and a second electrode plate disposed on a side of the first electrode plate away from the base substrate.

The plurality of power supply lines include a plurality of first power connection lines located in a first conductive layer and a plurality of second power connection lines located in a second conductive layer, the second conductive layer is located on a side of the first conductive layer away from the base substrate, the first power connection line and the second power connection line extend in a first direction, the plurality of first power connection lines and the plurality of second power connection lines are arranged in a second direction, the first direction and the second direction intersect.

The two adjacent first power connection lines are connected by a connection part located at the first conductive layer, and the orthographic projection of the connection part on the base substrate at least partially overlaps the orthographic projection of the second electrode plate on the base substrate.

In some possible implementations, the first power connection line and the second power connection line of a same pixel circuit are connected, and the orthographic projection of the first power connection line on the base substrate covers the orthographic projection of the second power connection line on the base substrate.

In some possible implementations, the display substrate further includes a light emitting structure layer provided on a side of the drive structure layer away from the base substrate, the light emitting structure layer includes a plurality of light emitting elements; the light emitting element is connected to the pixel circuit, at least one light emitting element includes an anode, an organic light emitting layer and a cathode stacked sequentially on the drive structure layer; an anode of the light emitting element includes an anode body part and an anode connection part, the orthographic projection of an effective light emitting region of the light emitting element on the base substrate is located inside the orthographic projection of a corresponding anode body part on the base substrate, the anode connection part is connected to the pixel circuit and the anode body part, respectively.

The light emitting element includes a first light emitting element, a second light emitting element, a third light emitting element and a fourth light emitting element; the first light emitting element emits red light, the second light emitting element emits blue light, the third light emitting element and the fourth light emitting element emit green light.

The anode body part of the first light emitting element and the anode body part of the second light emitting element have a hexagonal shape respectively, the anode body part of the second light emitting element has an area larger than an area of the anode body part of the first light emitting element, the anode body part of the third light emitting element and the anode body part of the fourth light emitting element have a pentagonal shape respectively, and the anode body part of the third light emitting element and the anode body part of the fourth light emitting element are symmetrical about a virtual straight line extending in the second direction.

In some possible implementations, the pixel circuit includes a first pixel circuit to a fourth pixel circuit, wherein the first pixel circuit is a pixel circuit connected to the first light emitting element, the second pixel circuit is a pixel circuit connected to the second light emitting element, the third pixel circuit is a pixel circuit connected to the third light emitting element, and the fourth pixel circuit is a pixel circuit connected to the fourth light emitting element.

The connection part includes a first power connection part with an orthographic projection on the base substrate that overlaps the orthographic projection of a second electrode plate of the first pixel circuit on the base substrate, and a second power connection part with an orthographic projection on the base substrate that overlaps the orthographic projection of a second electrode plate of the fourth pixel circuit on the base substrate; the first power connection part and the second power connection part extend in the second direction, a virtual straight line extending in the second direction passes through the first power connection part and the second power connection part respectively.

In some possible implementations, the pixel circuit includes a drive transistor; the drive structure layer further includes a first electrode block located in the second pixel circuit; the first electrode block is located in the second conductive layer and connected to a second power connection line of the second pixel circuit.

For the second pixel circuit, the orthographic projection of the first electrode block on the base substrate partially overlaps orthographic projections of a gate electrode of the driver transistor and the second electrode plate on the base substrate.

In some possible implementations, the pixel circuit further includes a first reset transistor and a compensation transistor; the drive structure layer further includes a second electrode block located in the fourth pixel circuit, the second electrode block is located in the second conductive layer and connected to a second power connection line of the fourth pixel circuit.

For the fourth pixel circuit, the orthographic projection of the second electrode block on the base substrate at least partially overlaps orthographic projections of a first electrode of the first reset transistor, a gate electrode of the compensation transistor and a gate electrode of the driver transistor on the base substrate.

In some possible implementations, the second electrode block of the fourth pixel circuit forms a closed loop with the second power connection line of the fourth pixel circuit.

The second electrode block includes a first electrode connection part, a second electrode connection part and a third electrode connection part.

The first electrode connection part extends in the second direction and is connected to the second power connection line of the fourth pixel circuit and is connected to the second electrode connection part.

The second electrode connection part extends in the first direction and is connected to the third electrode connection part.

The third electrode connection part extends in the second direction and is connected to the second power connection line of the fourth pixel circuit.

In some possible implementations, the drive structure layer further includes a third electrode block located in the third pixel circuit, the third electrode block is located in the second conductive layer and connected to a second power connection line of the third pixel circuit.

For the third pixel circuit, the orthographic projection of the third electrode block on the base substrate partially overlaps the orthographic projections of the gate electrode of the compensation transistor and the gate electrode of the driver transistor on the base substrate.

In some possible implementations, the pixel circuit further includes a second reset transistor, the drive structure layer further includes a fourth electrode block located in the fourth pixel circuit, the fourth electrode block is located in the second conductive layer and connected to the second power connection line of the fourth pixel circuit.

For the fourth pixel circuit, the orthographic projection of the fourth electrode block on the base substrate partially overlaps the orthographic projections of a gate electrode and a first electrode of the second reset transistor on the base substrate.

In some possible implementations, the pixel circuits arranged in an array further include a plurality of data lines located in the second conductive layer, the data line extends in the first direction.

The orthographic projection of the anode body part of the second light emitting element on the base substrate at least partially overlaps the orthographic projections of the first electrode block located in the second pixel circuit and the second electrode block of the fourth pixel circuit on the base substrate; wherein the orthographic projection of the first electrode block on the base substrate is located on one side of a bisector of the anode body part of the second light emitting element extending in the first direction, the orthographic projection of the second electrode block on the base substrate is located on the other side of the bisector, the orthographic projection of the data line on the base substrate partially overlaps the orthographic projection of the bisector of the anode body part of the second light emitting element extending in the first direction on the base substrate.

In some possible implementations, the orthographic projection of the anode body part of the third light emitting element on the base substrate covers the orthographic projection of the third electrode block located in the third pixel circuit on the base substrate, the orthographic projection of the anode body part of the third light emitting element on the base substrate partially overlaps the orthographic projection of the second power connection line on the base substrate; wherein the second power connection line of the third pixel circuit is located on one side of a bisector of the anode body part of the third light emitting element extending in the first direction.

In some possible implementations, the orthographic projection of the anode body part of the fourth light emitting element on the base substrate covers the orthographic projection of the fourth electrode block located in the fourth pixel circuit on the base substrate, the orthographic projection of the anode body part of the fourth light emitting element on the base substrate partially overlaps the orthographic projection of the second power connection line on the base substrate; wherein the second power connection line of the fourth pixel circuit is located on one side of a bisector of the anode body part of the fourth light emitting element extending in the first direction.

In some possible implementations, the orthographic projection of the anode body part of the second light emitting element on the base substrate does not overlap the orthographic projection of a hollow region on the base substrate, the hollow region is a region enclosed by the second electrode block and the second power connection line.

In some possible implementations, the distance between the boundary of the anode body part of the second light emitting element and the boundary of the first electrode block covered by the anode body part of the second light emitting element is greater than or equal to 0.5 micron and less than or equal to 1 micron, and the distance between the boundary of the anode body part of the second light emitting element and the boundary of the second electrode connection part of the second electrode block covered by the anode body part of the second light emitting element is greater than or equal to 0.5 micron and less than or equal to 1 micron.

The distance between the boundary of the anode body part of the third light emitting element and the boundary of the third electrode block covered by the anode body part of the third light emitting element is greater than or equal to 0.5 micron and less than or equal to 1 micron.

The distance between the boundary of the anode body part of the fourth light emitting element and the boundary of the fourth electrode block covered by the anode body part of the fourth light emitting element is greater than or equal to 0.5 micron and less than or equal to 1 micron.

In some possible implementations, the pixel circuits arranged in an array further include a plurality of reset signal lines, a plurality of scan signal lines, a plurality of light emitting signal lines, a plurality of first initial signal lines and a plurality of second initial signal lines; the reset signal lines, the scan signal lines and the light emitting signal lines are disposed in the same layer as the first electrode plate, the first initial signal lines and the second initial signal lines are disposed in the same layer as the second electrode plate.

The plurality of reset signal lines, the plurality of scan signal lines, the plurality of light emitting signal lines, the plurality of first initial signal lines and the plurality of second initial signal lines extend in the second direction and are arranged in the first direction.

The pixel circuit includes a first reset signal terminal, a second reset signal terminal, a first initial signal terminal, a second initial signal terminal, a scan signal terminal, a light emitting signal terminal and a data signal terminal, wherein the first reset signal terminal and the second reset signal terminal are electrically connected to different reset signal lines respectively, the scan signal terminal is electrically connected to the scan signal line, the light emitting signal terminal is electrically connected to the light emitting signal line, the first initial signal terminal is electrically connected to the first initial signal line, the second initial signal terminal is electrically connected to the second initial signal line, and the data signal terminal is electrically connected to the data signal line.

In some possible implementations, the pixel circuit includes a plurality of transistors, the drive structure layer includes a semiconductor layer, a first insulating layer, a third conductive layer, a second insulating layer, a fourth conductive layer, a third insulating layer, a first conductive layer, a fourth insulating layer and a second conductive layer stacked sequentially on the base substrate.

The semiconductor layer includes active layers of a plurality of transistors located in at least one pixel circuit.

The third conductive layer includes a reset signal line, a scan signal line, a light emitting signal line, a first electrode plate and gate electrodes of a plurality of transistors.

The fourth conductive layer includes a first initial signal line, a second initial signal line and a second electrode plate.

The first conductive layer includes a first power connection line, a first power connection part, a second power connection part, and a connection block.

The second conductive layer includes a second power connection line, a data signal line, a first electrode block, a second electrode block, a third electrode block and a fourth electrode block.

In some possible implementations, the drive structure layer further includes a plurality of reset connection lines located in the second conductive layer, the reset connection line extends in the first direction, and the plurality of reset connection lines are arranged in the second direction.

The reset connection line is electrically connected to a plurality of first initial signal lines through a connection block located in the first conductive layer; the orthographic projection of the reset connection line on the base substrate at least partially overlaps a the orthographic projection of a bisector of the anode body part of the first light emitting element extending in the first direction on the base substrate.

In some possible implementations, the pixel circuits located on a same row as the pixel circuit and adjacent to the pixel circuit are a first adjacent pixel circuit and a second adjacent pixel circuit, respectively, a first electrode of a first reset transistor of the pixel circuit is connected to a first electrode of a first reset transistor of the first adjacent pixel circuit through the semiconductor layer, and a first electrode of a second reset transistor of the pixel circuit is connected to a first electrode of a second reset transistor of the second adjacent pixel circuit through the semiconductor layer.

The first initial signal line is connected with the pixel circuit and the first electrode of the first reset transistor of the first adjacent pixel circuit through a via, and the second initial signal line is connected with the pixel circuit and the first electrode of the second reset transistor of the second adjacent pixel circuit through a via.

In some possible implementations, the reset signal line and the scan signal line of the pixel circuit are located on a same side of the first electrode plate of the pixel circuit, and the reset signal line is located on a side of the scan signal line away from the first electrode plate of the pixel circuit, and the light emitting signal line of the pixel circuit is located on a side of the first electrode plate of the pixel circuit away from the scan signal line.

The second initial signal line of the pixel circuit is located between the first initial signal line of a next row of pixel circuits and the second electrode plate of the next row of pixel circuits, and is located on a side of the second electrode plate of the pixel circuit away from the first initial signal line of the pixel circuit.

In some possible implementations, the reset connection line includes a first protrusion protruding in the second direction towards one side of the reset connection line and a second protrusion protruding towards the other side of the reset connection line.

The first protrusion and the second protrusion both overlap a virtual straight line extending in the second direction, and orthographic projections of the first protrusion and the second protrusion on the base substrate both partially overlap the orthographic projection of the anode body part of the first light emitting element.

In some possible implementations, the pixel circuit further includes a write transistor, a first light emitting control transistor and a second light emitting control transistor.

A first electrode and a second electrode of the first reset transistor, a first electrode of the compensation transistor, a first electrode of the first light emitting control transistor, a second electrode of the second light emitting transistor, a first electrode and a second electrode of the second reset transistor are located on a side of the first power connection line of the pixel circuit close to the first power connection line of the previous column of the pixel circuits, and a first electrode of the write transistor is located on a side of the first power connection line of the pixel circuit close to the first power connection line of the next column of the pixel circuits.

A first electrode and a second electrode of the first reset transistor and a first electrode of the compensation transistor of the first pixel circuit are located on a first side of the first power connection part, and a second electrode of the second light emitting control transistor and a first electrode and a second electrode of the second reset transistor are located on a second side of the first power connection part.

A first electrode and a second electrode of the first reset transistor and a first electrode of the compensation transistor of the fourth pixel circuit are located on a first side of the second power connection part, and a second electrode of the second light emitting control transistor and a first electrode and a second electrode of the second reset transistor are located on a second side of the second power connection part.

In some possible implementations, the reset connection line is located on a side of the second power connection line of the pixel circuit away from the data signal line.

The data signal line of the pixel circuit is located between the second power connection line of the pixel circuit and the second power connection line of an adjacent pixel circuit.

In some possible implementations, the first power connection line and the second power connection line of the pixel circuit include a first boundary and a second boundary.

The distance between the first boundary of the first power connection line and the first boundary of the second power connection line is greater than or equal to 0.5 micron and less than or equal to 1 micron.

The distance between the second boundary of the first power connection line and the second boundary of the second power connection line is greater than or equal to 0.5 micron and less than or equal to 1 micron.

In a second aspect, the present disclosure further provides a display apparatus, including the display substrate described above.

Other aspects may be understood upon reading and understanding the drawings and the detailed description.

BRIEF DESCRIPTION OF DRAWINGS

Accompanying drawings are used for providing further understanding for technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1A:
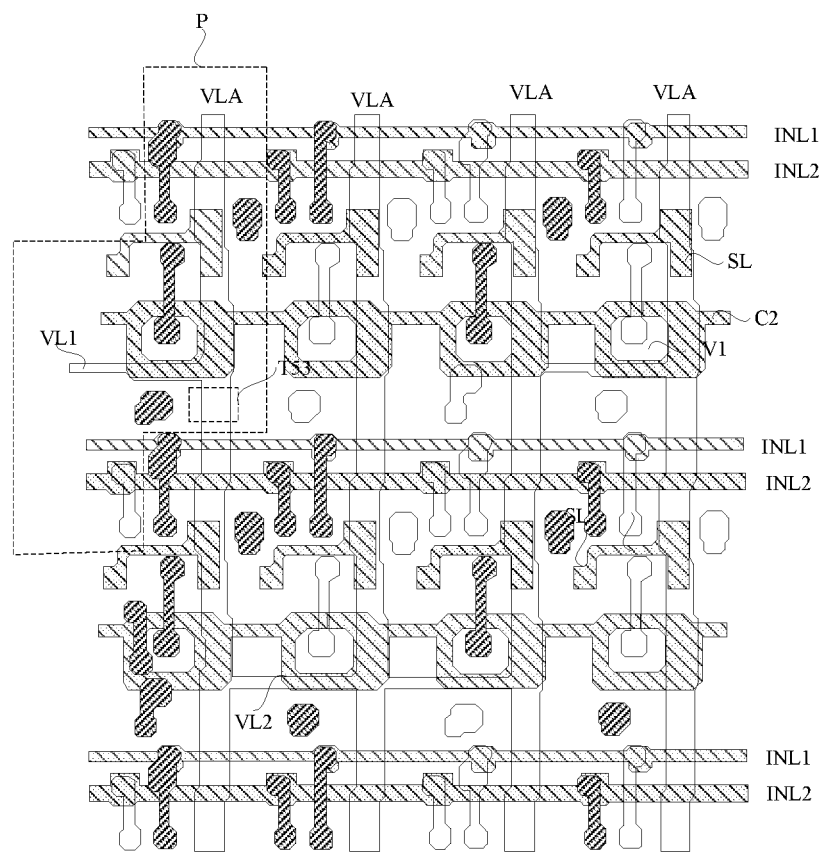
FIG. 1A is a schematic diagram I of structures of a film layer in which a second electrode plate is located and a first conductive layer in a display substrate according to an embodiment of the present disclosure.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

The display substrate includes a pixel circuit and a power supply line that provides a power supply signal to the pixel circuit, and the loss of the power supply line during transmission will affect the display uniformity of the display substrate.

Figure 1B:
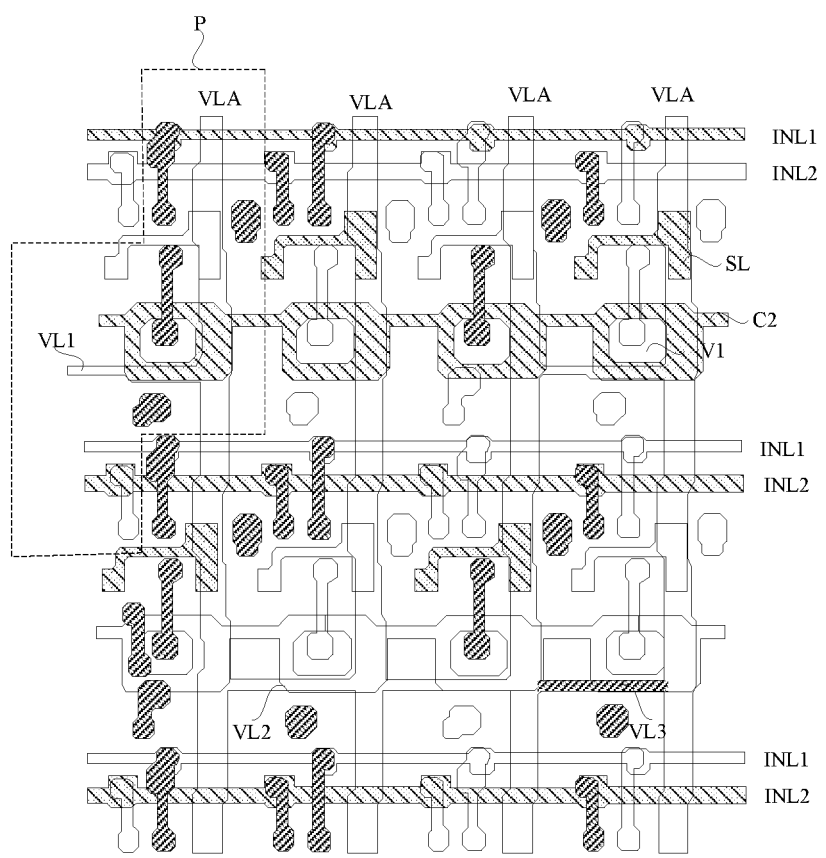
FIG. 1B is a schematic diagram II of structures of a film layer in which a second electrode plate is located and a first conductive layer in a display substrate according to an embodiment of the present disclosure.
Figure 2:
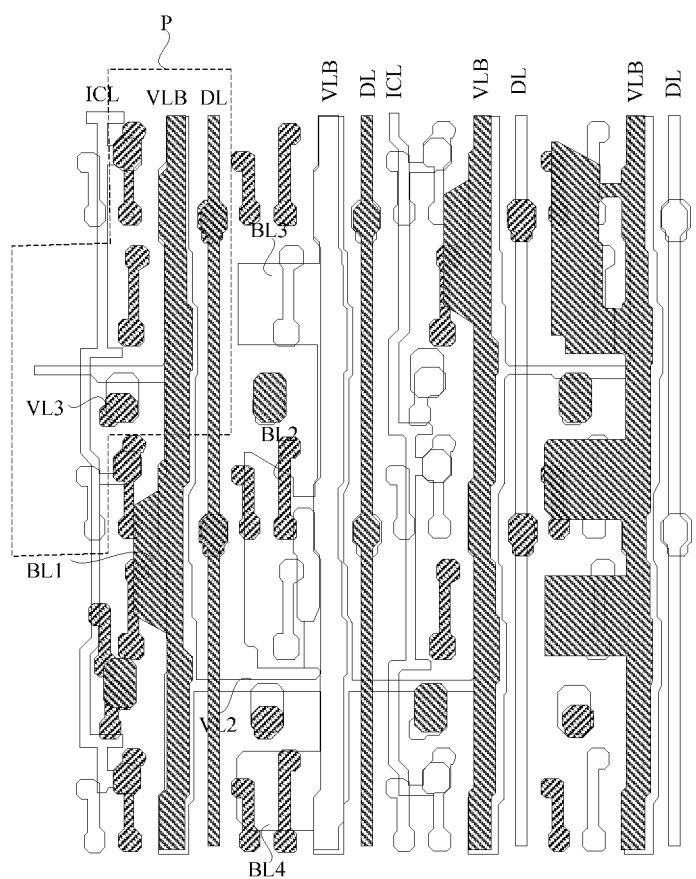
FIG. 2 is a schematic diagram of structures of a first conductive layer and a second conductive layer in a display substrate according to an embodiment of the present disclosure.

FIG. 1A is a schematic diagram I of structures of a film layer in which a second electrode plate is located and a first conductive layer in a display substrate according to an embodiment of the present disclosure, FIG. 1B is a schematic diagram II of structures of a film layer in which a second electrode plate is located and a first conductive layer in a display substrate according to an embodiment of the present disclosure, and FIG. 2 is a schematic diagram of structures of a first conductive layer and a second conductive layer in a display substrate according to an embodiment of the present disclosure. As shown in FIG. 1A, FIG. 1B and FIG. 2, the display substrate according to an embodiment of the present disclosure may include: a base substrate and a drive structure layer provided on the base substrate, the drive structure layer includes: pixel circuits arranged in an array P, the pixel circuits arranged in an array include: a plurality of power supply lines, which are configured to provide a power supply signal, the pixel circuit further includes: a capacitor, the capacitor includes: a first electrode plate and a second electrode plate C2 located on a side of the first electrode plate away from the base substrate.

In an exemplary embodiment, as shown in FIG. 2, the plurality of power supply lines includes: a plurality of first power connection lines VLA disposed in the first conductive layer and a plurality of second power connection lines VLB disposed in the second conductive layer, the second conductive layer is disposed on a side of the first conductive layer away from the base substrate.

In an exemplary embodiment, the first power connection line VLA and the second power connection line VLB extend in a first direction, and the plurality of first power connection lines VLA and the plurality of second power connection lines VLB are arranged in a second direction, and the first direction and the second direction intersect.

In the present disclosure, two adjacent first power connection lines VLA are connected by a connection part disposed in the first conductive layer, and the orthographic projection of the connection part on the base substrate at least partially overlap the orthographic projection of the second electrode plate C2 on the base substrate.

In an exemplary embodiment, the display substrate may be a Low Temperature Polycrystalline Oxide (LTPO) display substrate or a Low Temperature Poly-silicon (LTPS) display substrate.

In an exemplary embodiment, at least one power supply line continuously provides a high-level signal.

In an exemplary embodiment, the base substrate may be a rigid substrate or a flexible substrate, wherein the rigid substrate may be, but is not limited to, one or more of glass and conductive foil; the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

A display substrate according to an embodiment of the present disclosure includes a base substrate and a drive structure layer disposed on the base substrate, the drive structure layer includes pixel circuits arranged in an array, the pixel circuits arranged in an array include a plurality of power supply lines, the power supply lines are configured to provide a power supply signal; the pixel circuit further includes a capacitor, the capacitor includes a first electrode plate and a second electrode plate disposed on a side of the first electrode plate away from the base substrate; the plurality of power supply lines include: a plurality of first power connection lines disposed in a first conductive layer and a plurality of second power connection lines disposed in a second conductive layer, the second conductive layer is disposed on a side of the first conductive layer away from the base substrate, the first power connection line and the second power connection line extend in a first direction, the plurality of first power connection lines and the plurality of second power connection lines arranged in a second direction, the first direction and the second direction intersect; two adjacent first power connection lines are connected by a connection part located at the first conductive layer, the orthographic projection of the connection part on the base substrate at least partially overlaps the orthographic projection of the second electrode plate on the base substrate. The present disclosure reduces the loss of power supply lines during transmission and improves the display uniformity of the display substrate by connecting the two adjacent first power connection lines through the connection part located in the first conductive layer.

In an exemplary embodiment, as shown in FIG. 1A, FIG. 1B, and FIG. 2, a first power connection line VLA and a second power connection line VLB of a same pixel circuit are connected, and the orthographic projection of the first power connection line VLA on the base substrate covers the orthographic projection of the second power connection line VLB on the base substrate.

In an exemplary embodiment, the fact that the orthographic projection of the first power connection line on the base substrate over the orthographic projection of the second power connection line in a same pixel circuit on the base substrate can prevent the second power connection line from exceeding the first power connection line due to the alignment deviation in the process, and can improve the optical fingerprint recognition effect of the display substrate.

In an exemplary embodiment, the first power connection line and the second power connection line of the pixel circuit respectively include a first boundary and a second boundary.

In an exemplary embodiment, the distance between the first boundary of the first power connection line and the first boundary of the second power connection line is greater than or equal to 0.5 micron and less than or equal to 1 micron.

In an exemplary embodiment, the distance between the second boundary of the first power connection line and the second boundary of the second power connection line is greater than or equal to 0.5 micron and less than or equal to 1 micron.

In an exemplary embodiment, the display substrate may further include: a light emitting structure layer disposed on a side of the drive structure layer away from the base substrate, the light emitting structure layer includes a plurality of light emitting elements; the light emitting elements are connected to a pixel circuit.

In an exemplary embodiment, the light emitting element may be an Organic Light Emitting Diode (OLED) or a Quantum dot Light Emitting Diode (QLED). Among them, the OLED may include a first electrode (anode), an organic emitting layer, and a second electrode (cathode) that are stacked.

In an exemplary embodiment, the organic emitting layer may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary embodiment, hole injection layers of all sub pixels may be connected together to form a common layer, electron injection layers of all the sub pixels may be connected together to form a common layer, hole transport layers of all the sub pixels may be connected together to form a common layer, electron transport layers of all the sub pixels may be connected together to form a common layer, hole block layers of all the sub pixels may be connected together to form a common layer, emitting layers of adjacent sub pixels may be overlapped slightly, or may be isolated from each other, and electron block layers of adjacent sub pixels may be overlapped slightly, or may be isolated from each other.

In an exemplary embodiment, the pixel circuit may be 7T1C or 8T1C, which is not limited in the present disclosure.

Figure 3A:
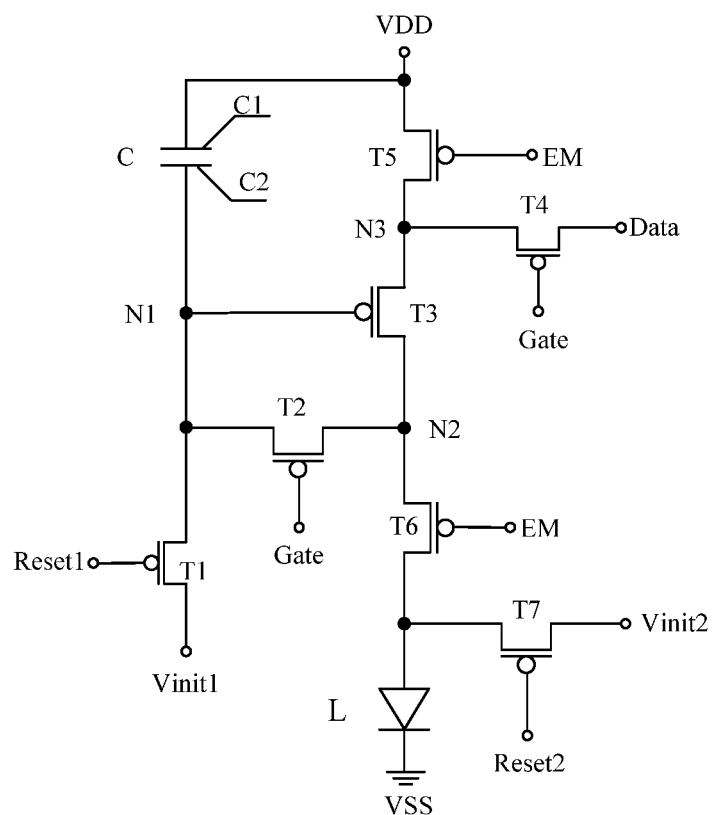
FIG. 3A is an equivalent circuit diagram of a pixel circuit.

In an exemplary embodiment, FIG. 3A is an equivalent circuit schematic of a pixel circuit. FIG. 3A is illustrated with 7T1C as an example. As shown in FIG. 3A, the pixel circuit may include seven transistors (a first transistor T1 to a seventh transistor T7), one capacitor C, and nine signal terminals (a data signal terminal Data, a scan signal terminal Gate, a first reset signal terminal Reset1, a second reset signal terminal Reset2, a light emitting signal terminal EM, a first initial signal terminal Vinit1, a second initial signal terminal Vinit2, a first power supply terminal VDD and a second power supply terminal VSS). Herein, the capacitor C includes a first electrode plate C1 and a second electrode plate C2. The transistor includes an active layer, a gate, a first electrode, and a second electrode.

In an exemplary embodiment as shown in FIG. 3A, a first electrode plate of the capacitor C is connected with the first power supply terminal VDD, and a second electrode plate of the capacitor C is connected with a first node N1. A gate electrode of the first transistor T1 is connected with the first reset signal terminal Reset1, a first electrode of the first transistor T1 is connected with the first initial signal terminal Vinit1, and a second electrode of the first transistor is connected with the first node N1. A gate electrode of the second transistor T2 is connected with the scan signal terminal Gate, a first electrode of the second transistor T2 is connected with the first node N1, and a second electrode of the second transistor T2 is connected with the second node N2. A gate of the third transistor T3 is connected with the first node N1, a first electrode of the third transistor T3 is connected with a third node N3, and a second electrode of the third transistor T3 is connected with the second node N2. A gate electrode of the fourth transistor T4 is connected with the scan signal terminal Gate, a first electrode of the fourth transistor T4 is connected with the data signal terminal Data, and a second electrode of the fourth transistor T4 is connected with the third node N3. A gate of the fifth transistor T5 is connected with the light emitting signal terminal EM, a first electrode of the fifth transistor T5 is connected with the first power supply terminal VDD, and a second electrode of the fifth transistor T5 is connected with the third node N3. A gate of the sixth transistor T6 is connected with the light emitting signal terminal EM, a first electrode of the sixth transistor T6 is connected with the second node N2, and a second electrode of the sixth transistor T6 is connected with a first electrode of a light emitting element. A gate electrode of the seventh transistor T7 is connected with the scan signal terminal Gate, a first electrode of the seventh transistor T7 is connected with the second initial signal terminal Vinit2, a second electrode of the seventh transistor T7 is connected with a first electrode of the light emitting element, and a second electrode of the light emitting element is connected with the second power supply terminal VSS.

In an exemplary embodiment, the first transistor T1 may be referred to as a first reset transistor, and when an effective level signal is input to the first reset signal terminal Reset1, the first transistor T1 transmits an initialization voltage to the first node N1 to initialize a charge amount of the first node N1.

In an exemplary embodiment, the second transistor T2 may be referred to as a compensation transistor, and when an effective level signal is input to the scanning signal terminal Gate, the second transistor T2 transmits the signal of the second node N2 to the first node N1 to compensate for the signal of the first node N1.

In an exemplary embodiment, the third transistor T3 may be referred to as a drive transistor, and the third transistor T3 determines the drive current flowing between the first power supply terminal VDD and the second power supply terminal VSS based on the potential difference between the gate electrode and the first electrode.

In an exemplary embodiment, the fourth transistor T4 may be referred to as a write transistor, etc., and when an effective level signal is input to the scan signal terminal Gate, the fourth transistor T4 causes an data voltage of the data signal terminal Data to be input to the pixel circuit.

In an exemplary embodiment, the fifth transistor T5 may be referred to as a first light emitting control transistor and the sixth transistor T6 may be referred to as a second light emitting control transistor. When an effective level signal is input to the light emitting signal terminal EM, the fifth transistor T5 and the sixth transistor T6 enable a light emitting element to emit light by forming a path of drive current between the first power supply terminal VDD and the second power supply terminal VSS.

In an exemplary embodiment, the seventh transistor T7 may be referred to as a second reset transistor, and when an effective level signal is input to the second reset signal terminal Reset2, the seventh transistor T7 transmits an initialization voltage to the first electrode of the light emitting element to initialize a charge amount of the first electrode of the light emitting element.

In an exemplary embodiment, a signal of the first power supply terminal VDD is a high-level signal continuously provided, and a signal of the second power supply terminal VSS is a low-level signal.

In an exemplary embodiment, the first transistor T1 to the seventh transistor T7 may be P-type transistors or N-type transistors. Use of transistors of a same type in a pixel circuit may simplify a process flow, reduce process difficulties of a display panel, and improve a product yield.

In an exemplary embodiment, the first transistor T1 to the seventh transistor T7 may include a P-type transistor and an N-type transistor.

In the following, taking the seven transistors in FIG. 3A as all P-type transistors as an example, an exemplary embodiment of the present disclosure will be explained through the working process of the pixel circuit.

In an exemplary embodiment, the operating process of the pixel circuit may include following stages.

In a first stage, referred to as a reset stage, the signals of the first reset signal terminal Reset1 and the second reset signal terminal Reset2 are low-level signals, and the signals of the scan signal terminal Gate and the light emitting signal terminal EM are high-level signals. The signal of the first reset signal terminal Reset1 is a low-level signal, the first transistor T1 is turned on, and the signal of the first initial signal terminal Vinit1 is provided to the first node N1 to initialize the capacitor C and clear the original data voltage in the capacitor C. The signal of the second reset signal terminal Reset2 is a low-level signal, the seventh transistor T7 is turned on, the signal of the second initial signal terminal Vinit2 is provided to the first electrode of the light emitting element L, to initialize the first electrode of the light emitting element and clear the original data voltage in the first electrode of the light emitting element L. The signals of the scan signal terminal Gate and the light emitting signal terminal EM are high-level signals, the second transistor T2, the fourth transistor T4, the fifth transistor T5, and the sixth transistor T6 are turned off, and in this stage, the light emitting element L does not emit light.

In a second stage, referred to as a data writing stage or a threshold compensation stage, the signal of the scan signal terminal Gate is a low-level signal, the signals of the first reset signal terminal Reset1, the second reset signal terminal Reset2 and the light emitting signal terminal EM are high-level signals, and the data signal terminal Data outputs a data voltage. In this stage, because the signal of the first node N1 is a low-level signal, the third transistor T3 is turned on. The signal of the scan signal terminal Gate is the low-level signal, and the second transistor T2 and the fourth transistor T4 are turned on. The second transistor T2 and the fourth transistor T4 are turned on so that the data voltage output from the data signal terminal Data is provided to the first node N1 through the third node N3, the turned-on third transistor T3, the second node N2, and the turned-on second transistor T2. A difference between the data voltage output by the data signal terminal Data and a threshold voltage of the third transistor T3 is charged into the capacitor C until the voltage of the first node N1 is Vd−|Vth|, wherein Vd is the data voltage output by the data signal terminal Data, and Vth is the threshold voltage of the third transistor T3. The signals of the first reset signal terminal Reset1 and the second reset signal terminal Reset2 are high-level signals, and the first transistor T1 and the seventh transistor T7 are turned off. The signal of the light emitting signal line EM is the high-level signal, and the fifth transistor T5 and the sixth transistor T6 are turned off.

In a third stage, referred to as a light emitting stage, the signal of the light emitting signal terminal EM is a low-level signal, and the signals of the first reset signal terminal Reset1, the second reset signal terminal Reset2 and the scan signal terminal Gate are all high-level signals. The signals of the light emitting signal terminal EM are low-level signals, the fifth transistor T5 and the sixth transistor T6 are turned on, and a power supply voltage outputted by the first power terminal VDD provides a driving voltage to the first electrode of the light emitting element L through the fifth transistor T5, third transistor T3 and sixth transistor T6, which are all turned on, to drive the light emitting element L to emit light.

In the driving process of the pixel circuit, a drive current flowing through the third transistor T3 (a drive transistor) is determined by a voltage difference between a gate electrode and a first electrode. Because the voltage of the first node N1 is Vd−|Vth|, the drive current of the third transistor T3 is as follows:

$$I = K * (Vgs - Vth)^2 = K * [(Vdd - Vd + |Vth|) - Vth]^2 = K * [(Vdd - Vd]^2$$

Herein, I is the drive current flowing through the third transistor T3, i.e., a drive current for driving the light emitting element L, K is a constant, Vgs is the voltage difference between the gate electrode and first electrode of the third transistor T3, Vth is the threshold voltage of the third transistor T3, Vd is the data voltage output by the data signal terminal Data, and Vdd is the power supply voltage output by the first power supply terminal VDD.

Figure 3B:
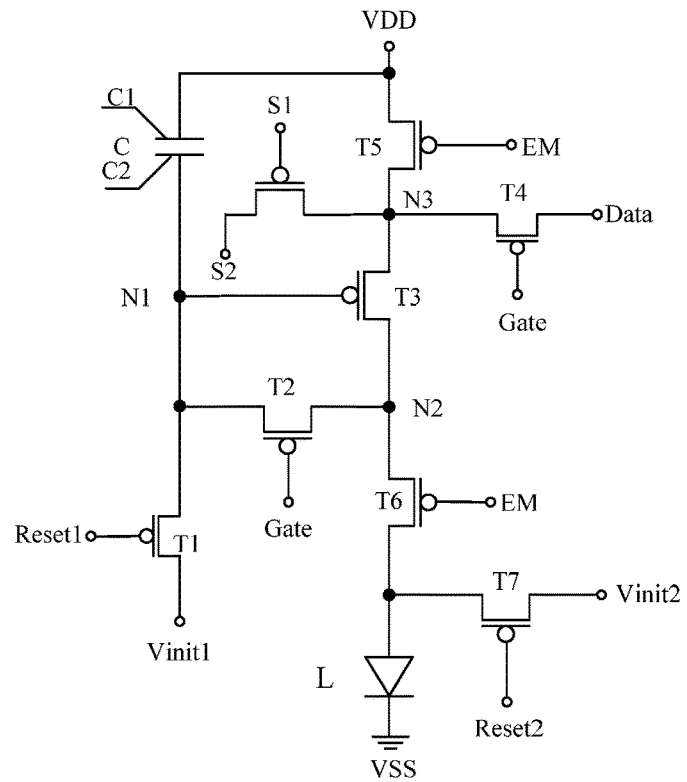
FIG. 3B is an equivalent circuit diagram of another pixel circuit.

In an exemplary embodiment, FIG. 3B is an equivalent circuit diagram of another pixel circuit. FIG. 3B is illustrated with 8T1C as an example. As shown in FIG. 3B, a pixel circuit may include 8 transistors (a first transistor T1 to an eighth transistor T8), one capacitor C, and 11 signal terminals (a data signal terminal Data, a scan signal terminal Gate, a first reset signal terminal Reset1, a second reset signal terminal Reset2, a light emitting signal terminal EM, a first initial signal terminal Vinit1, a second initial signal terminal Vinit2, a first control terminal S1, a second control terminal S2, a first power supply terminal VDD and a second power supply terminal VSS). Herein, the capacitor C includes a first electrode plate C1 and a second electrode plate C2. A pixel circuit provided in FIG. 3B differs from a pixel circuit provided in FIG. 3A in that an eighth transistor T8 is added, wherein a gate electrode of the eighth transistor T8 is electrically connected to the first control terminal S1, a first electrode of the eighth transistor T8 is electrically connected to the second control terminal S2, and a second electrode of the eighth transistor T8 is electrically connected to the third node N3.

In an exemplary embodiment, the first control terminal S1 may be the first reset signal terminal Reset1.

In an exemplary embodiment, the second control terminal S2 may be the first initial signal terminal Vinit1, or may be the second initial signal terminal Vinit2, or may be other signal terminal, which is not limited in present disclosure.

In an exemplary embodiment, the eighth transistor T8 may be referred to as a third reset transistor, and when an effective level signal is input to the first control terminal S1, the eighth transistor T8 transmits an initialization voltage to the third node N3 to initialize a charge amount of the third node N3.

The working process of a pixel circuit provided in FIG. 3B differs from that of a pixel circuit provided in FIG. 3A is that in the first stage, the eighth transistor T8 in a pixel circuit provided in FIG. 3B is turned on and initializes the third node N3.

In an exemplary embodiment, at least one light emitting element includes an anode, an organic light emitting layer, and a cathode stacked sequentially on a drive structure layer. The orthographic projection of the effective light emitting region of the light emitting element on the base substrate is located inside the orthographic projection of the corresponding anode body part on the base substrate.

In an exemplary embodiment, the anode of the light emitting element includes: an anode body part and an anode connection part; the anode connection part is connected to the pixel circuit and the anode body part, respectively.

Figure 4:
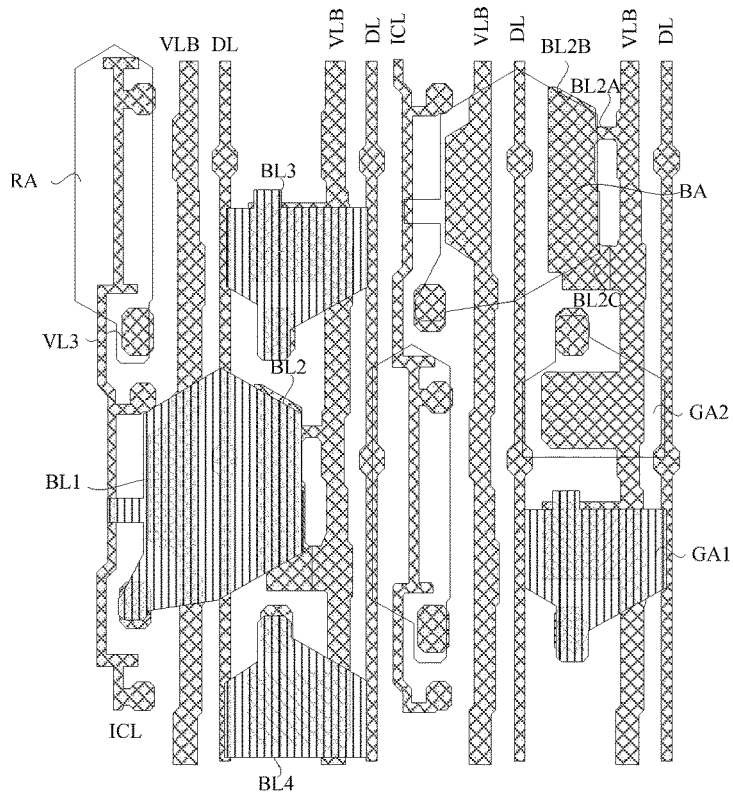
FIG. 4 is a schematic diagram of structures of a second conductive layer and an anode layer of a display substrate according to an exemplary embodiment.

In an exemplary embodiment, the light emitting element includes: a first light emitting element, a second light emitting element, a third light emitting element, and a fourth light emitting element; the first light emitting element emits red light, the second light emitting element emits blue light, and the third light emitting element and the fourth light emitting element emit green light. FIG. 4 is a schematic diagram of structures of a second conductive layer and an anode layer of a display substrate according to an exemplary embodiment, where the anode layer is a film layer where the anode is located, FIG. 4 includes: the anode RA of the first light emitting element, the anode BA of the second light emitting element, the anode GA1 of the third light emitting element and the anode GA2 of the fourth light emitting element.

In an exemplary embodiment, as shown in FIG. 4, the anode body part of the first light emitting element and the anode body part of the second light emitting element have a hexagonal shape, and the area of the anode body part of the second light emitting element is larger than the area of the anode body part of the first light emitting element.

In an exemplary embodiment, as shown in FIG. 4, the anode body part of the third light emitting element and the anode body part of the fourth light emitting element have a pentagonal shape, and the anode body part of the third light emitting element and the anode body part of the fourth light emitting element are symmetrical about a virtual straight line extending in a second direction.

In an exemplary embodiment, the shapes of the anode body part of the third light emitting element and the anode body part of the fourth light emitting element may include an acute angle, the acute angle included in the shape of the anode body part of the third light emitting element opens upward, and the acute angle included in the shape of the anode body part of the fourth light emitting element opens downward.

In an exemplary embodiment, as shown in FIG. 4, the light emitting elements located in a same row are arranged in a first arrangement mode or in a second arrangement mode, in the first arrangement mode, the first light emitting element, the third light emitting element, the second light emitting element and the fourth light emitting element are arranged sequentially in the second direction; in a second arrangement mode, the second light emitting element, the fourth light emitting element, the first light emitting element and the third light emitting element are arranged sequentially in the second direction, wherein the first light emitting element and the second light emitting element in adjacent rows are located in a same column, and the third light emitting element and the fourth light emitting element in adjacent rows are located in a same column.

In an exemplary embodiment, the pixel circuit includes a first pixel circuit to a fourth pixel circuit, wherein the first pixel circuit is a pixel circuit connected to a first light emitting element, the second pixel circuit is a pixel circuit connected to a second light emitting element, the third pixel circuit is a pixel circuit connected to a third light emitting element, and the fourth pixel circuit is a pixel circuit connected to a fourth light emitting element.

In an exemplary embodiment, the first electrode and second electrode of the first reset transistor, the first electrode of the compensation transistor, the first electrode of the first light emitting control transistor, the second electrode of the second light emitting transistor, the first electrode and second electrode of the second reset transistor are located on a side of the first power connection line of the pixel circuit close to the first power connection line of the previous column of pixel circuits, and the first electrode of the write transistor is located on a side of the first power connection line of the pixel circuit close to the first power connection line of the next column of the pixel circuits.

In an exemplary embodiment, the first electrode and the second electrode of the first reset transistor and the first electrode of the compensation transistor of the first pixel circuit are disposed on a first side of the first power connection part, and the second electrode of the second light emitting control transistor and the first electrode and the second electrode of the second reset transistor are disposed on a second side of the first power connection part.

In an exemplary embodiment, the first electrode and the second electrode of the first reset transistor and the first electrode of the compensation transistor of the fourth pixel circuit are disposed on a first side of the second power connection part, and the second electrode of the second light emitting control transistor and the first electrode and the second electrode of the second reset transistor are disposed on a second side of the second power connection part.

In an exemplary embodiment, as shown in FIG. 1A and FIG. 1B, the connection part may include: a first power connection part VL1 with an orthographic projection on the base substrate that overlaps the orthographic projection of a second electrode plate of the first pixel circuit on the base substrate and a second power connection part VL2 with an orthographic projection on the base substrate that overlaps the orthographic projection of the second electrode plate of the fourth pixel circuit on the base substrate.

In an exemplary embodiment, a virtual straight line extending in the second direction passes through said first power connection part and said second power connection part, respectively, as shown in FIGS. 1A and 1B.

In an exemplary embodiment, as shown in FIG. 1A and FIG. 1B, the first power connection part VL1 and the second power connection part VL2 extend in the second direction and are provided in the same layer as the first power connection line.

In an exemplary embodiment, as shown in FIG. 1B, the connection part may include: a third power connection part VL3 with an orthographic projection on the base substrate that overlaps the orthographic projection of the second electrode plate of the second pixel circuit on the base substrate, or a third power connection part VL3 with an orthographic projection on the base substrate that overlaps the orthographic projection of the second electrode plate of the third pixel circuit on the base substrate, FIG. 1B is illustrated by taking that the connection part includes the third power connection part VL3 with an orthographic projection on the base substrate that overlaps the orthographic projection of the second electrode plate of the third pixel circuit on the base substrate as an example. The connection part according to an embodiment of the present disclosure is disposed in such a way that a ring is included between adjacent first power supply connection lines of the first conductive layer, which can prevent the gate electrode of the driver transistor from being interfered with by an external signal and improve the reliability of the display substrate.

In an exemplary embodiment, as shown in FIGS. 1A and 1B, the second electrode plate of the capacitor of at least one pixel circuit is opened with a first via V1 that exposes the first electrode plate of the capacitor.

In an exemplary embodiment, the first power connection line of the pixel circuit is connected to the second electrode plate of the capacitor as shown in FIG. 1A and FIG. 1B.

In an exemplary embodiment, the second electrode plates of the capacitors of adjacent pixel circuits disposed in a same row are electrically connected as shown in FIG. 1A and FIG. 1B. The second electrode plates of the capacitors of adjacent pixel circuits located in a same row are electrically connected to reduce the loss of power supply lines during transmission and improve the display uniformity of the display substrate.

In an exemplary embodiment, as shown in FIGS. 2 and 4, the drive structure layer may further include: a first electrode block BL1 disposed in the second pixel circuit; the first electrode block BL1 is disposed in the second conductive layer and is connected to a second power connection line of the second pixel circuit.

In an exemplary embodiment, for the second pixel circuit, the orthographic projection of the first electrode block on the base substrate partially overlaps the orthographic projections of the gate electrode and the second electrode plate of the driver transistor on the base substrate.

In the present disclosure, the first electrode block BL1 can ensure the flatness of the anode of the second light emitting element and can improve the display effect of the display substrate.

In an exemplary embodiment, as shown in FIGS. 2 and 4, the drive structure layer may further include: a second electrode block BL2 disposed in the fourth pixel circuit, the second electrode block is disposed in the second conductive layer and connected to a second power connection line of the fourth pixel circuit.

In an exemplary embodiment, for the fourth pixel circuit, the orthographic projection of the second electrode block on the base substrate at least partially overlaps the orthographic projections of the first electrode of the first reset transistor, the gate electrode of the compensation transistor, and the gate electrode of the driver transistor on the base substrate.

In the present disclosure, the second electrode block BL2 can ensure the flatness of the anode of the fourth light emitting element and can improve the display effect of the display substrate.

In an exemplary embodiment, as shown in FIGS. 2 and 4, the second electrode block of the fourth pixel circuit forms a closed loop with the second power connection line VLB of the fourth pixel circuit; the second electrode block BL2 includes: a first electrode connection part BL2A, a second electrode connection part BL2B, and a third electrode connection part BL2C.

In an exemplary embodiment, the first electrode connection part BL2A extends in a second direction and is connected to the second power connection line VLB and the second electrode connection part BL2B of the fourth pixel circuit; the second electrode connection part BL2B extends in a first direction and is connected to the third electrode connection part BL2C; the third electrode connection part BL2C extends in the second direction and is connected to the second power connection line VLB of the fourth pixel circuit.

In an exemplary embodiment, as shown in FIGS. 2 and 4, the drive structure layer may further include: a third electrode block BL3 disposed in the third pixel circuit, the third electrode block BL3 is disposed in the second conductive layer and connected to the second power connection line of the third pixel circuit.

In an exemplary embodiment, for the third pixel circuit, the orthographic projection of the third electrode block on the base substrate partially overlaps the orthographic projections of the gate electrode of the compensation transistor and the gate electrode of the driver transistor on the base substrate.

In the present disclosure, the arrangement of the third electrode block BL3 can ensure the flatness of the anode of the third light emitting element and can improve the display effect of the display substrate.

In an exemplary embodiment, as shown in FIGS. 2 and 4, the drive structure layer further includes: a fourth electrode block BL4 disposed in the fourth pixel circuit, and the fourth electrode block BL4 is disposed in the second conductive layer.

In an exemplary embodiment, for the fourth pixel circuit, the orthographic projection of the fourth electrode block on the base substrate partially overlaps the orthographic projections of the gate electrode and the first electrode of the second reset transistor on the base substrate.

In the present disclosure, the arrangement of the fourth electrode block BL4 can ensure the flatness of the anode of the fourth light emitting element and can improve the display effect of the display substrate.

In an exemplary embodiment, as shown in FIGS. 2 and 4, the display substrate further includes: a plurality of data lines DL disposed in a second conductive layer, and the data line DL extends in the first direction.

In an exemplary embodiment, the orthographic projection of the anode body part of the second light emitting element on the base substrate at least partially overlaps the orthographic projections of the first electrode block BL1 located in the second pixel circuit and the second electrode block BL2 of the fourth pixel circuit located on the base substrate. Herein, the orthographic projection of the first electrode block BL1 on the base substrate is located on one side of a bisector of the anode body part of the second light emitting element extending in the first direction, the orthographic projection of the second electrode block BL2 on the base substrate is located on the other side of the bisector, and the orthographic projection of the data line DL on the base substrate partially overlaps the orthographic projection of the bisector of the anode body part of the second light emitting element extending in the first direction on the base substrate.

In an exemplary embodiment, the orthographic projection of the anode body part of the third light emitting element on the base substrate covers the orthographic projection of the third electrode block BL3 located in the third pixel circuit located on the base substrate. The orthographic projection of the anode body part of the third light emitting element on the base substrate partially overlaps the orthographic projection of the second power connection line on the base substrate; wherein the second power connection line of the third pixel circuit is located on one side of a bisector extending in the first direction of the anode body part of the third light emitting element.

In an exemplary embodiment, the orthographic projection of the anode body part of the fourth light emitting element on the base substrate covers the orthographic projection of the fourth electrode block BL4 located in the fourth pixel circuit on the base substrate, and the orthographic projection of the anode body part of the fourth light emitting element on the base substrate partially overlaps the orthographic projection of the second power connection line on the base substrate; wherein the second power connection line of the fourth pixel circuit is located on one side of a bisector extending in the first direction of the anode body part of the fourth light emitting element.

In an exemplary embodiment, as shown in FIG. 4, the orthographic projection of the anode body part of the second light emitting element on the base substrate does not overlap the orthographic projection of the hollow region on the base substrate, and the hollow region is the region enclosed by the second electrode block BL2 and the second power connection line VLB.

In an exemplary embodiment, as shown in FIG. 4, the distance between the boundary of the anode body part of the second light emitting element and the boundary of the first electrode block BL1 covered by the anode body part of the second light emitting element is greater than or equal to 0.5 micron and less than or equal to 1 micron, and the distance between the boundary of the anode body part of the second light emitting element and the boundary of the second electrode connection part BL2B of the second electrode block BL2 covered by the anode body part of the second light emitting element is greater than or equal to 0.5 micron and less than or equal to 1 micron.

In an exemplary embodiment, as shown in FIG. 4, the distance between the boundary of the anode body part of the third light emitting element and the boundary of the third electrode block BL3 covered by the anode body part of the third light emitting element is greater than or equal to 0.5 micron and less than or equal to 1 micron.

In an exemplary embodiment, as shown in FIG. 4, the distance between the boundary of the anode body part of the fourth light emitting element and the boundary of the fourth electrode block BL4 covered by the anode body part of the fourth light emitting element is greater than or equal to 0.5 micron and less than or equal to 1 micron.

In an exemplary embodiment, as shown in FIG. 1A, FIG. 1B, and FIG. 2, the pixel circuits arranged in an array further include: a plurality of reset signal lines, a plurality of scan signal lines, a plurality of light emitting signal lines, a plurality of first initial signal lines INL1, and a plurality of second initial signal lines INL2; the reset signal lines, scan signal lines, and light emitting signal lines are disposed in the same layer as the first electrode plate, and the first initial signal lines and second initial signal lines are disposed in the same layer as the second electrode plate.

In an exemplary embodiment, the plurality of reset signal lines, the plurality of scan signal lines, the plurality of light emitting signal lines, the plurality of first initial signal lines, and the plurality of second initial signal lines extend in a second direction and are arranged in a first direction.

Said pixel circuit includes a first reset signal terminal, a second reset signal terminal, a first initial signal terminal, a second initial signal terminal, a scan signal terminal, a light emitting signal terminal and a data signal terminal, wherein the first reset signal terminal and the second reset signal terminal are electrically connected to different reset signal lines respectively, the scan signal terminal is electrically connected to a scan signal line, the light emitting signal terminal is electrically connected to a light emitting signal line, the first initial signal terminal is electrically connected to a first initial signal line, the second initial signal terminal is electrically connected to a second initial signal line, and the data signal terminal is electrically connected to a data signal line.

In an exemplary embodiment, the pixel circuitry includes: a plurality of transistors. The drive structure layer may include: a semiconductor layer, a first insulating layer, a third conductive layer, a second insulating layer, a fourth conductive layer, a third insulating layer, a first conductive layer, a fourth insulating layer, and a second conductive layer stacked sequentially on a base substrate.

In an exemplary embodiment, the semiconductor layer may include: an active layer of a plurality of transistors disposed in at least one pixel circuit.

In an exemplary embodiment, the third conductive layer may include: a reset signal line, a scan signal line, a light emitting signal line, and gate electrodes of a plurality of transistors.

In an exemplary embodiment, the fourth conductive layer includes a first initial signal line, a second initial signal line, and a second electrode plate.

In an exemplary embodiment, the first conductive layer includes: a first power connection line, a first power connection part, a second power connection part, and a connection block.

In an exemplary embodiment, the second conductive layer includes: a second power connection line, a data signal line, a first electrode block, a second electrode block, a third electrode block, and a fourth electrode block.

In an exemplary embodiment, the light emitting structure layer may include: an anode layer, a pixel definition layer, an organic material layer, and a cathode layer.

In an exemplary embodiment, the anode layer may include: an anode of a light emitting element.

In an exemplary embodiment, the organic material layer may include: an organic light emitting layer of a light emitting element.

In an exemplary embodiment, the cathode layer may include: a cathode of a light emitting element.

In an exemplary embodiment, as shown in FIGS. 2 and 4, the pixel circuits arranged in an array further include: a plurality of reset connection lines ICL disposed in a second conductive layer, the reset connection line extends in a first direction, and the plurality of reset connection lines are arranged in a second direction.

In an exemplary embodiment, as shown in FIGS. 2 and 4, the reset connection line is electrically connected to a plurality of first initial signal lines through a connection block located in the first conductive layer; the orthographic projection of the reset connection line on the base substrate at least overlaps the orthographic projection of a bisector extending in the first direction of the anode body part of the first light emitting element on the base substrate.

Herein, the connection block may be a first electrode of the first reset transistor.

In an exemplary embodiment, the semiconductor layers of adjacent pixel circuits may be disposed at intervals, or may be connected to each other.

When the semiconductor layers of adjacent pixel circuits are connected to each other, the pixel circuits located in a same row as said pixel circuit and adjacent to said pixel circuit are a first adjacent pixel circuit and a second adjacent pixel circuit, respectively, the first electrode of the first reset transistor of said pixel circuit is connected to the first electrode of the first reset transistor of the first adjacent pixel circuit through the semiconductor layer, and the first electrode of the second reset transistor of said pixel circuit is connected to the first electrode of the second reset transistor of the second adjacent pixel circuit through the semiconductor layer.

When the semiconductor layers of adjacent pixel circuits are connected to each other, said first initial signal line is connected to the pixel circuit and the first electrode of the first reset transistor of the first adjacent pixel circuit through a via.

When the semiconductor layers of adjacent pixel circuits are connected to each other, said second initial signal line is connected to the pixel circuit and the first electrode of the second reset transistor of the second adjacent pixel circuit through a via.

In an exemplary embodiment, as shown in FIG. 1A and FIG. 1B, the reset connection line includes a first protrusion protruding in the second direction toward a side of the reset connection line and a second protrusion protruding toward the other side of the reset connection line. Herein, the first protrusion and the second protrusion both overlap a virtual straight line extending in the second direction, and orthographic projections of said first protrusion and said second protrusion on the base substrate both partially overlap the orthographic projection of the anode body part of the first light emitting element.

In an exemplary embodiment, the reset connection line is located on a side of the second power connection line of the pixel circuit away from the data signal line; the data signal line of the pixel circuit is located between the second power connection line of the pixel circuit and the second power connection line of an adjacent pixel circuit.

The structure of the display substrate will be described below through an example of a manufacturing process for the display substrate. A "patterning process" mentioned in the present disclosure includes film layer deposition, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a base substrate using a process of deposition or coating. If no patterning process is needed for the "thin film" in the whole making process, the "thin film" may also be called a "layer". If the patterning process is needed for the "thin film" in the whole making process, the thin film is called a "thin film" before the patterning process and called a "layer" after the patterning process. The "layer" after the patterning process includes at least one "pattern". "A and B are arranged in the same layer" in the present disclosure refers to that A and B are simultaneously formed by the same patterning process.

FIG. 5A to FIG. 21C are schematic diagrams of a preparation process for a display substrate according to an exemplary embodiment. As shown in FIG. 5A to FIG. 21C, the preparation process for the display substrate according to the exemplary embodiment may include following contents.

Figure 5A:
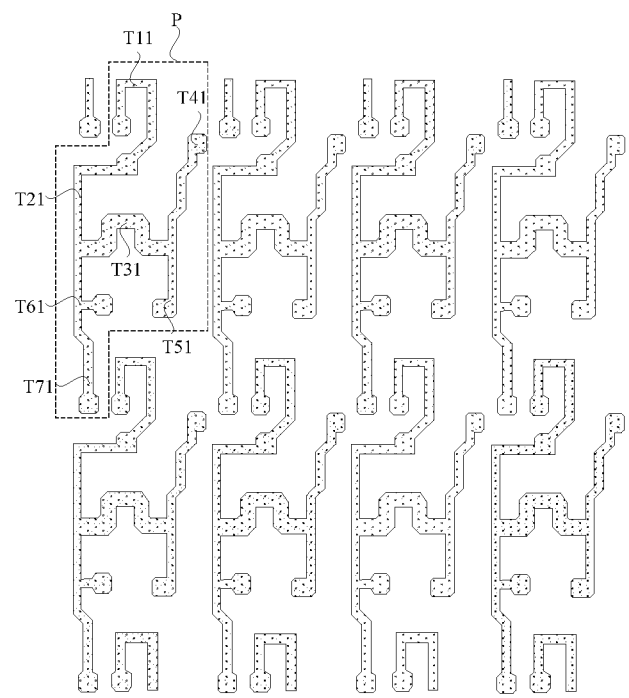
FIG. 5A is a schematic diagram I of a pixel circuit provided in FIG. 3A after a semiconductor layer pattern is formed.
Figure 5B:
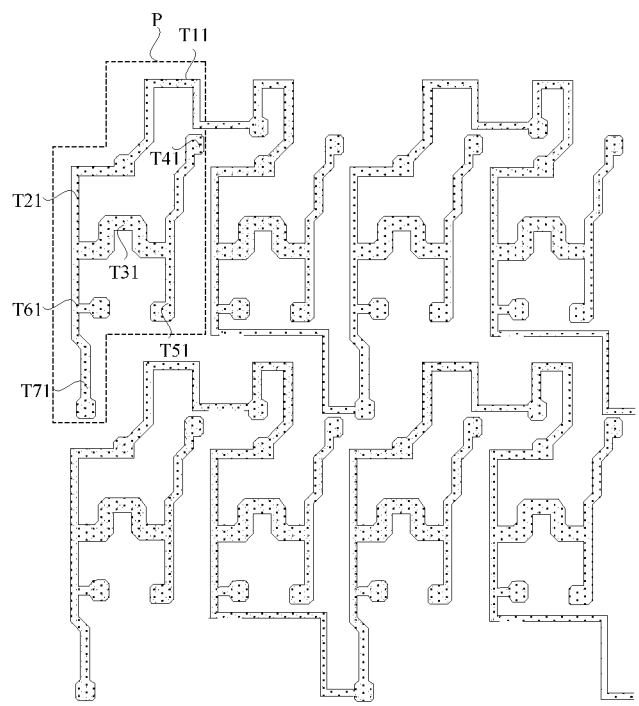
FIG. 5B is a schematic diagram II of a pixel circuit provided in FIG. 3A after a semiconductor layer pattern is formed.
Figure 5C:
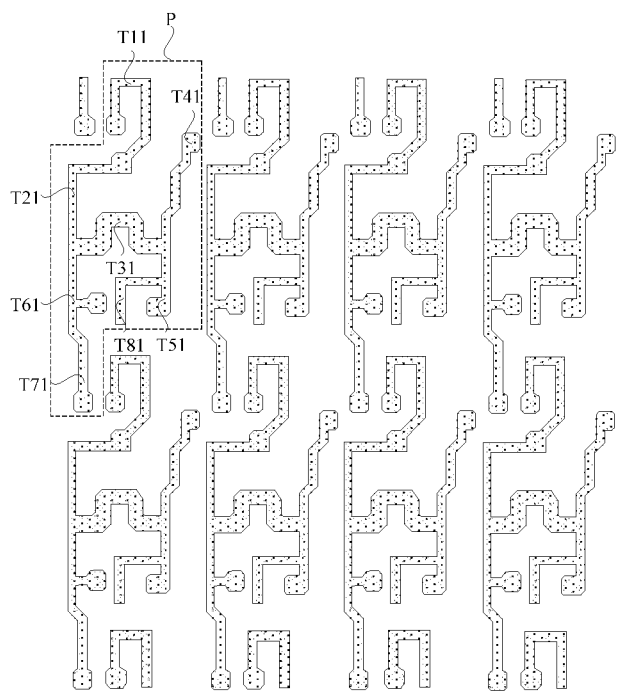
FIG. 5C is a schematic diagram of a pixel circuit provided in FIG. 3B after a semiconductor layer pattern is formed.

(1) Forming a semiconductor layer pattern on a base substrate, which includes: depositing a semiconductor film on the base substrate, patterning the semiconductor film using a patterning process to form a semiconductor layer pattern, as shown in FIG. 5A to FIG. 5C, FIG. 5A is a schematic diagram I of a pixel circuit provided in FIG. 3A after a semiconductor layer pattern is formed, FIG. 5B is a schematic diagram II of a pixel circuit provided in FIG. 3A after a semiconductor layer pattern is formed, and FIG. 5C is a schematic diagram of a pixel circuit provided in FIG. 3B after a semiconductor layer pattern is formed. Herein, FIG. 5A to FIG. 5C illustrate pixel circuits P with two rows and four columns as an example. FIG. 5A and FIG. 5B differ in that the semiconductor layers of adjacent pixel circuits are disposed at intervals in FIG. 5A, and the semiconductor layers of adjacent pixel circuits are connected to each other in FIG. 5B. The first electrode of the first transistor of the pixel circuit in FIG. 5B is connected to the first electrode of the first transistor of the first adjacent pixel circuit, and the first electrode of the seventh transistor of the pixel circuit is connected to the first electrode of the seventh transistor of the second adjacent pixel circuit.

In an exemplary embodiment, as shown in FIG. 5A and FIG. 5B, the semiconductor layer includes an active layer T11 of a first transistor, an active layer T21 of a second transistor, an active layer T31 of a third transistor, an active layer T41 of a fourth transistor, an active layer T51 of a fifth transistor, an active layer T61 of a sixth transistor, and an active layer T71 of a seventh transistor located in at least one pixel circuit. In an exemplary embodiment, the active layers T11 of the first transistor to the active layer T71 of the seventh transistor are integrally formed.

In an exemplary embodiment, the semiconductor layer in FIG. 5C differs from the semiconductor layer in FIG. 5A in that the semiconductor layer of FIG. 5C further includes an active layer T81 of the eighth transistor. In an exemplary embodiment, the active layers T11 of the first transistor to the active layer T81 of the eighth transistor are integrally formed.

Figure 6A:
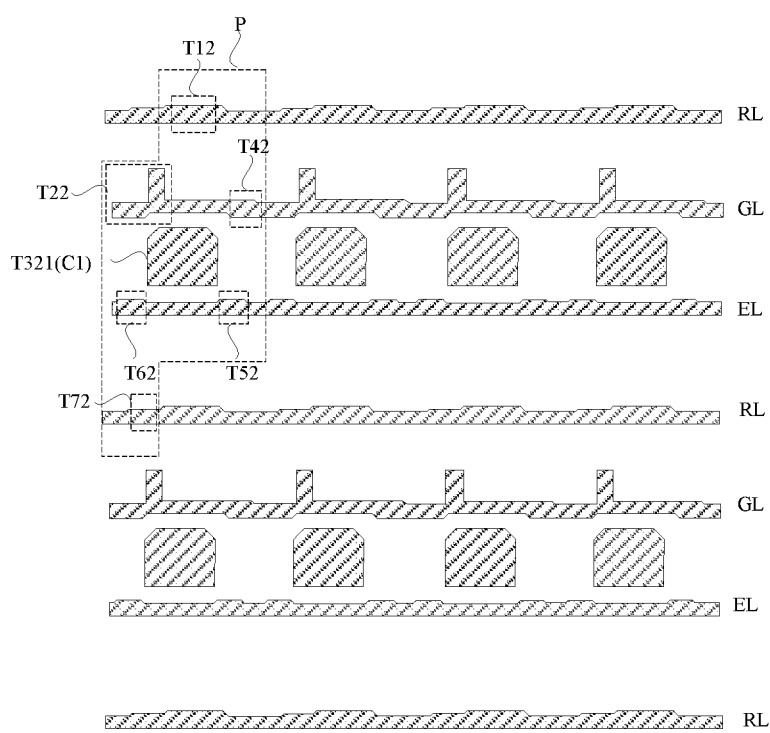
FIG. 6A is a schematic diagram of a pattern of a third conductive layer of a pixel circuit provided in FIG. 3A.
Figure 6B:
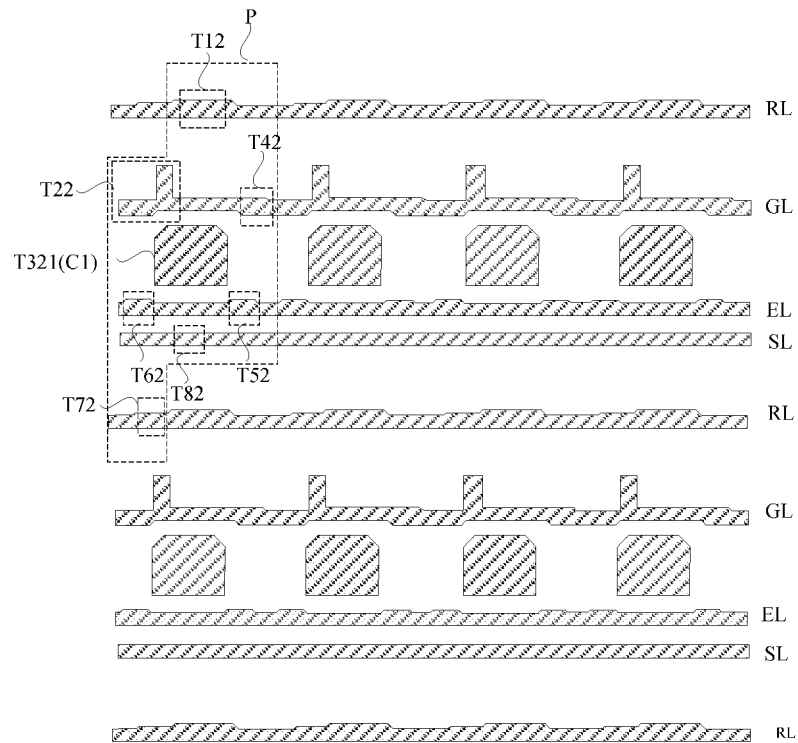
FIG. 6B shows a schematic diagram of a pixel circuit provided in FIG. 3B after a third conductive layer pattern is formed.
Figure 7A:
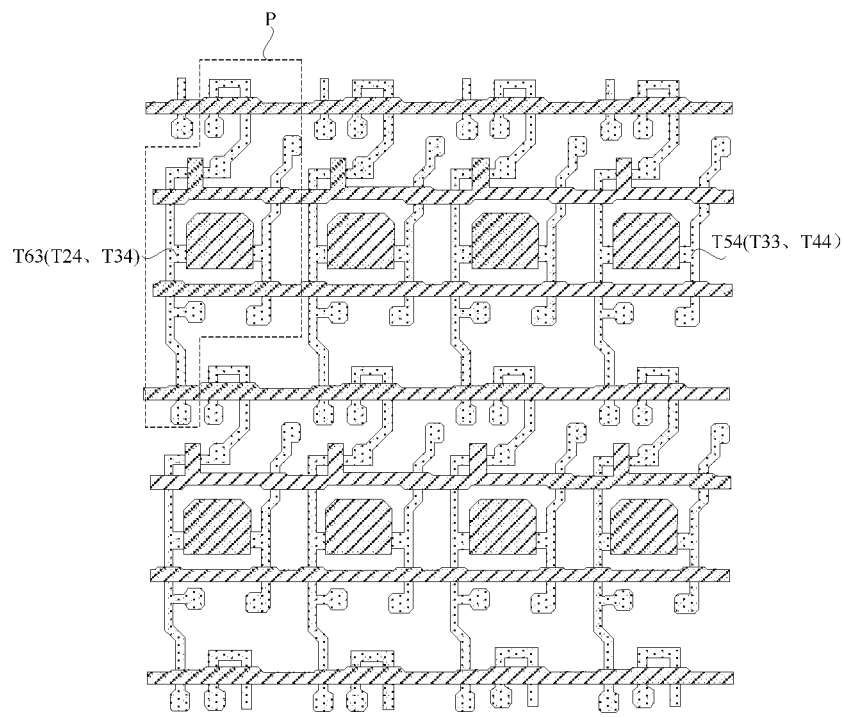
FIG. 7A is a schematic diagram I of a pixel circuit provided in FIG. 3A after a third conductive layer pattern is formed.
Figure 7B:
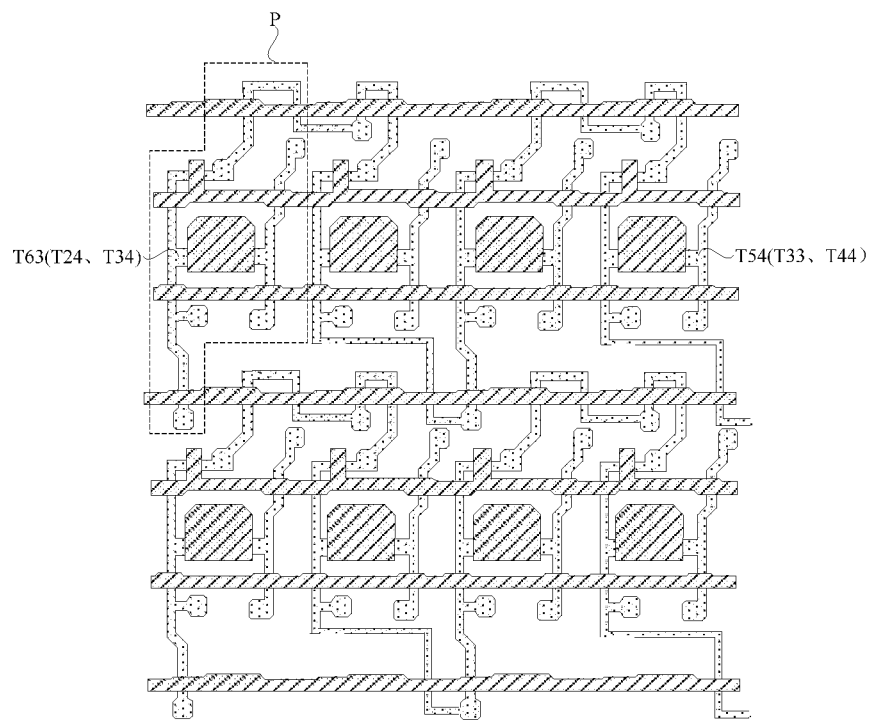
FIG. 7B is a schematic diagram II of a pixel circuit provided in FIG. 3A after a third conductive layer pattern is formed.
Figure 7C:
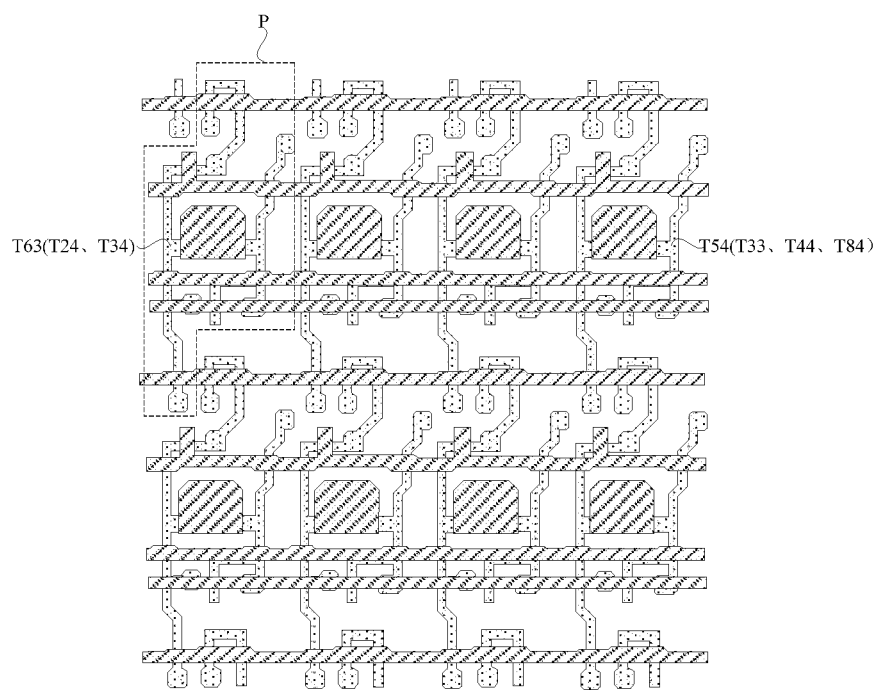
FIG. 7C is a schematic diagram of a pixel circuit provided in FIG. 3B after a third conductive layer pattern is formed.

(2) Forming a third conductive layer pattern, which includes: depositing a first insulating film and a third conductive film sequentially on the base substrate on which the aforementioned patterns are formed, patterning the first insulating film and the third conductive film using a patterning process to form a first insulating layer pattern and a third conductive layer pattern disposed on the first insulating layer, as shown in FIGS. 6A to 6B and 7A to 7C, FIG. 6A is a schematic diagram of a pattern of a third conductive layer of a pixel circuit provided in FIG. 3A, FIG. 6B shows a schematic diagram of a pixel circuit provided in FIG. 3B after a third conductive layer pattern is formed, FIG. 7A is a schematic diagram I of a pixel circuit provided in FIG. 3A after a third conductive layer pattern is formed, FIG. 7B is a schematic diagram II of a pixel circuit provided in FIG. 3A after a third conductive layer pattern is formed, and FIG. 7C is a schematic diagram of a pixel circuit provided in FIG. 3B after a third conductive layer pattern is formed. FIG. 7A and FIG. 7B differ in that the semiconductor layers of adjacent pixel circuits are disposed at intervals in FIG. 7A, and the semiconductor layers of adjacent pixel circuits are connected to each other in FIG. 7B.

In an exemplary embodiment, as shown in FIG. 6A, the third conductive layer of the pixel circuit provided in FIG. 3A may include: a plurality of reset signal lines RL, a plurality of scan signal lines GL, a plurality of light emitting signal lines EL, and a first electrode plate C1 located in a capacitor of at least one pixel circuit, a gate electrode T12 of a first transistor, a gate electrode T22 of a second transistor, a gate electrode T32 of a third transistor, a gate electrode T42 of a fourth transistor, a gate electrode T52 of a fifth transistor, a gate electrode T62 of a sixth transistor, and a gate electrode T72 of a seventh transistor.

In an exemplary embodiment, FIG. 6B differs from FIG. 6A in that the third conductive layer of the pixel circuit provided in FIG. 3B further includes a first control line SL electrically connected to a first control terminal of the pixel circuit.

In an exemplary embodiment, as shown in FIG. 6A and FIG. 6B, the reset signal line RL and the scan signal line GL of the pixel circuit are located on the same side of the first electrode plate C1 of the pixel circuit, and the reset signal line RL is located on the side of the scan signal line GL away from the first electrode plate C1 of the pixel circuit, and the light emitting signal line EL of the pixel circuit is located on the side of the first electrode plate C2 of the pixel circuit away from the scan signal line GL.

In an exemplary embodiment, as shown in FIG. 6B, the first control line SL is located between the light emitting signal line EL of the pixel circuit and the reset signal line RL of the next row of pixel circuits.

In an exemplary embodiment, as shown in FIG. 6A and FIG. 6B, for the pixel circuit, the gate electrode T12 of the first transistor and the reset signal line RL of the pixel circuit are integrally formed, the gate electrode T72 of the seventh transistor and the reset signal lines RL of the next row of the pixel circuits are integrally formed, the gate electrode T22 of the second transistor and the gate electrode T42 of the fourth transistor are integrally formed with the scan signal line GL of the pixel circuit, the gate electrode T32 of the third transistor and the first electrode plate C1 of the capacitor are integrally formed, and the gate electrode T52 of the fifth transistor and the gate electrode T62 of the sixth transistor are integrally formed with the light emitting signal line EL of the pixel circuit.

In an exemplary embodiment, the gate electrode T12 of the first transistor is disposed across the active layer of the first transistor, the gate electrode T22 of the second transistor is disposed across the active layer of the second transistor, the gate electrode T32 of the third transistor is disposed across the active layer of the third transistor, the gate electrode T42 of the fourth transistor is disposed across the active layer of the fourth transistor, the gate electrode T52 of the fifth transistor is disposed across the active layer of the fifth transistor, the gate electrode T62 of the sixth transistor is disposed across the active layer of the first transistor, and the gate electrode T72 of the seventh transistor is disposed across the active layer of the seventh transistor, i.e., an extension direction of a gate electrode of at least one transistor is perpendicular to an extension direction of an active layer.

In an exemplary embodiment, the gate electrode T82 of the eighth transistor and the first control line SL are integrally formed as shown in FIG. 6B. The gate electrode T82 of the eighth transistor is disposed across the active layer of the eighth transistor.

In an exemplary embodiment, as shown in FIG. 6A and FIG. 6B, the gate electrode of the second transistor of at least one pixel circuit includes a first control part and a second control part which are connected with each other, wherein the first control part extends in a second direction and the second control part extends in a first direction.

In an exemplary embodiment, this process further includes a conductorization processing. The conductorization processing is that after a first conductive layer pattern is formed, using a semiconductor layer in a gate electrode masking region of a plurality of transistors (i.e., the region where the semiconductor layer overlaps the gate electrode) as the channel region of the transistor, the semiconductor layer in the region not masked by the first conductive layer is processed into a conductorized layer to form a conductorized source-drain connection part. Therein, as shown in FIGS. 7A and 7B, the active layer of the conductorized sixth transistor is multiplexed as the first electrode T63 of the sixth transistor, the second electrode T24 of the second transistor, and the second electrode T34 of the third transistor, and the active layer of the conductorized fifth transistor is multiplexed as the second electrode T54 of the fifth transistor, the first electrode T33 of the third transistor, and the second electrode T44 of the fourth transistor. As shown in FIG. 7C, the active layer of the conductorized sixth transistor is multiplexed as the first electrode T63 of the sixth transistor, the second electrode T24 of the second transistor, and the second electrode T34 of the third transistor, and the active layer of the conductorized fifth transistor is multiplexed as the second electrode T54 of the fifth transistor, the first electrode T3 of the third transistor, the second electrode T44 of the fourth transistor, and the second electrode T84 of the eighth transistor.

Figure 8:
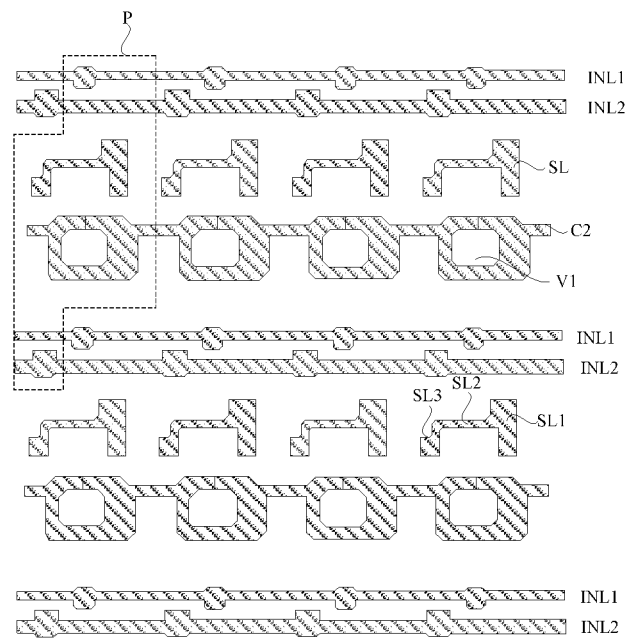
FIG. 8 is a schematic diagram of a pattern of a fourth conductive layer of a pixel circuit provided in FIGS. 3A and 3B.
Figure 9A:
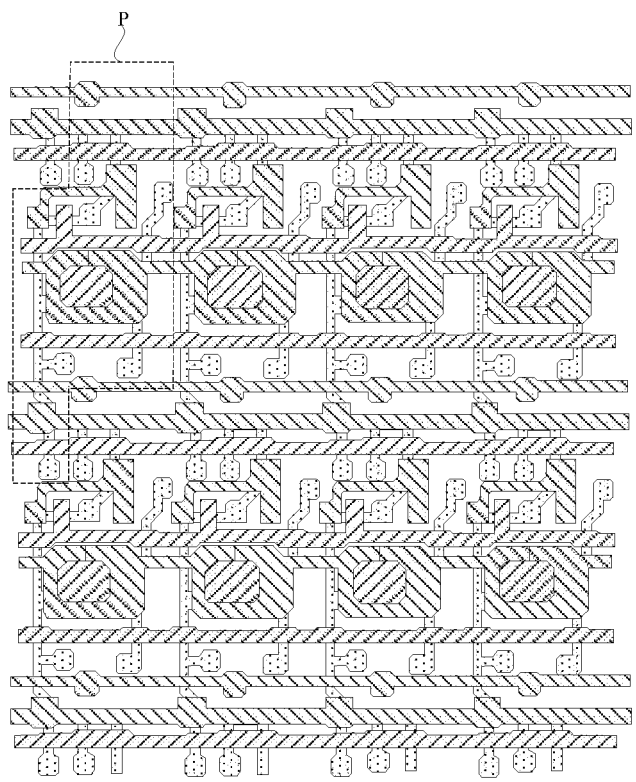
FIG. 9A is a schematic diagram I of a pixel circuit provided in FIG. 3A after a fourth conductive layer pattern is formed.
Figure 9B:
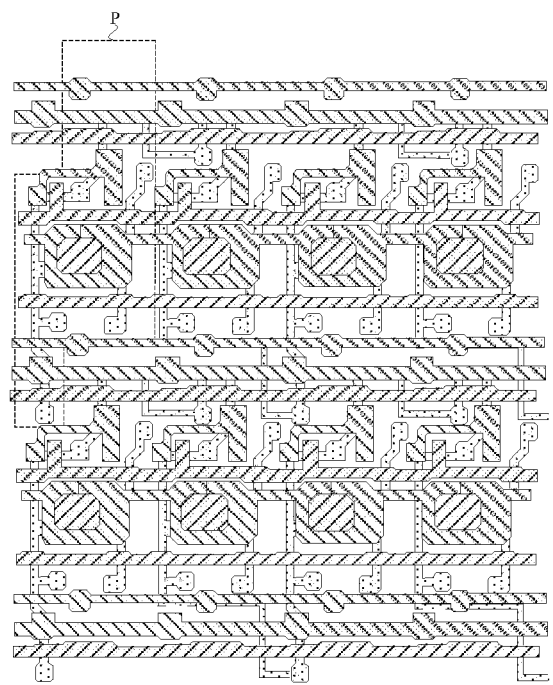
FIG. 9B is a schematic diagram II of a pixel circuit provided in FIG. 3A after a fourth conductive layer pattern is formed.
Figure 9C:
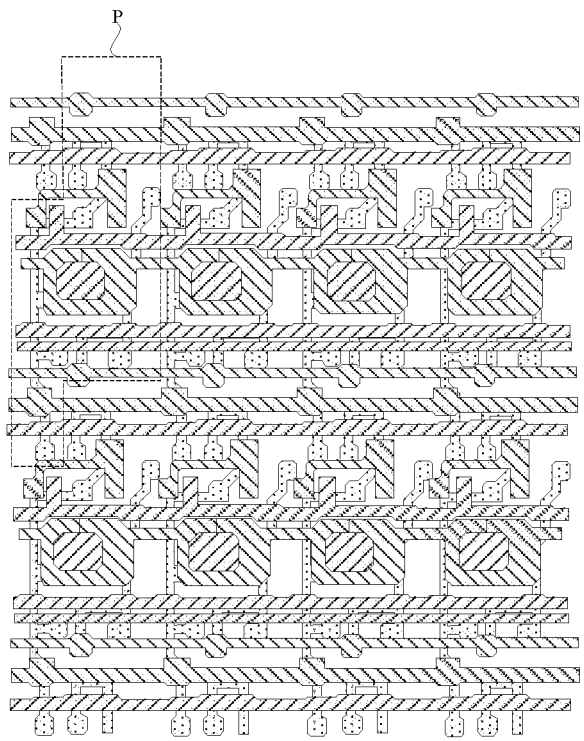
FIG. 9C is a schematic diagram of a pixel circuit provided in FIG. 3B after a fourth conductive layer pattern is formed.

(3) Forming a fourth conductive layer pattern, which includes: depositing a second insulating film and a fourth conductive film sequentially on the base substrate on which the aforementioned patterns are formed, patterning the second insulating film and the fourth conductive film using a patterning process to form a second insulating layer pattern and a fourth conductive layer pattern disposed on the second insulating layer, as shown in FIG. 8 and FIGS. 9A to 9C, FIG. 8 is a schematic diagram of a pattern of a fourth conductive layer of a pixel circuit provided in FIGS. 3A and 3B, FIG. 9A is a schematic diagram I of a pixel circuit provided in FIG. 3A after a fourth conductive layer pattern is formed, FIG. 9B is a schematic diagram II of a pixel circuit provided in FIG. 3A after a fourth conductive layer pattern is formed, and FIG. 9C is a schematic diagram of a pixel circuit provided in FIG. 3B after a fourth conductive layer pattern is formed. FIG. 9A and FIG. 9B differ in that the semiconductor layers of adjacent pixel circuits are disposed at intervals in FIG. 9A, and the semiconductor layers of adjacent pixel circuits are connected to each other in FIG. 9B.

In an exemplary embodiment, as shown in FIG. 8 and FIGS. 9A to 9C, the fourth conductive layer may include: a plurality of first initial signal lines INL1, a plurality of second initial signal lines INL2, a shield electrode CL and a second electrode plate C2.

In an exemplary embodiment, as shown in FIG. 8 and FIGS. 9A to 9C, the first initial signal line INL1 connected to the pixel circuit is located on a side of the shield electrode SL of the pixel circuit, and the second electrode plate C2 of the capacitor of the pixel circuit is located on a side of the shield electrode SL of the pixel circuit away from the first initial signal line INL1 connected to the pixel circuit.

In an exemplary embodiment, as shown in FIG. 8 and in FIGS. 9A to 9C, the second initial signal line INL2 of the pixel circuit is located between the first initial signal line INL1 of a next row of pixel circuits and the second electrode plates C2 of the next row of pixel circuits, and is located on a side of the second electrode plate C2 of the pixel circuit away from the first initial signal line of the pixel circuit.

In an exemplary embodiment, the second electrode plate C2 of the capacitor of at least one pixel circuit is opened with a first via V1 exposing the first electrode plate of the capacitor, wherein the orthographic projection of the first electrode plate C1 of the capacitor on the base substrate partially overlaps the orthographic projection of the second electrode plate C2 of the capacitor on the base substrate.

In an exemplary embodiment, the orthographic projection of the shield electrode SL of the pixel circuit on the base substrate partially overlaps the orthographic projections of the active layer of the first transistor and the active layer of the second transistor on the base substrate. The orthographic projection of the shield electrode SL on the base substrate partially overlaps the orthographic projection of the active layer of the second transistor on the base substrate, which can ensure the stability of the current of the second transistor and improve the display effect of the display panel.

In an exemplary embodiment, the shield electrode SL may include: a first shield electrode part SL1, a second shield electrode part SL2, and a third shield electrode part SL3 integrally formed.

In an exemplary embodiment, the first shield electrode part SL1 extends in a first direction and is connected to the second shield electrode part SL2, and the orthographic projection of the first shield electrode part SL1 on the base substrate partially overlaps the orthographic projection of the active layer of the first transistor on the base substrate.

In an exemplary embodiment, the second shield electrode part SL2 extends in a second direction and is connected to the third shield electrode part SL3.

In an exemplary embodiment, the third shield electrode part SL3 extends in the first direction and has an orthographic projection on the base substrate that partially overlaps the orthographic projection of the active layer of the second transistor on the base substrate.

Figure 10A:
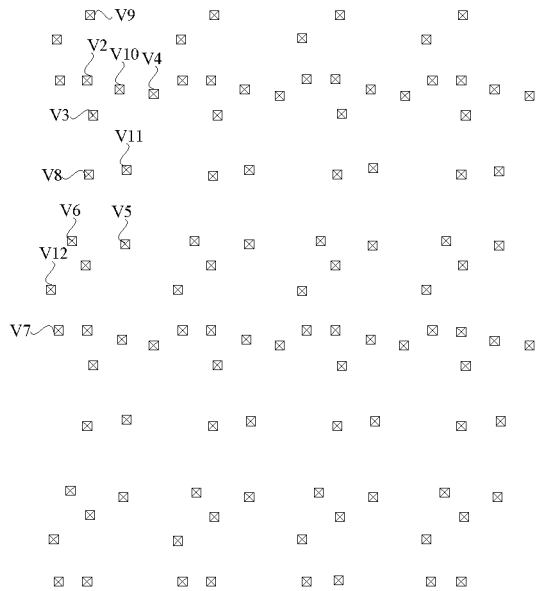
FIG. 10A is a schematic diagram I of a pattern of a third insulating layer of a pixel circuit provided in FIG. 3A.
Figure 10B:
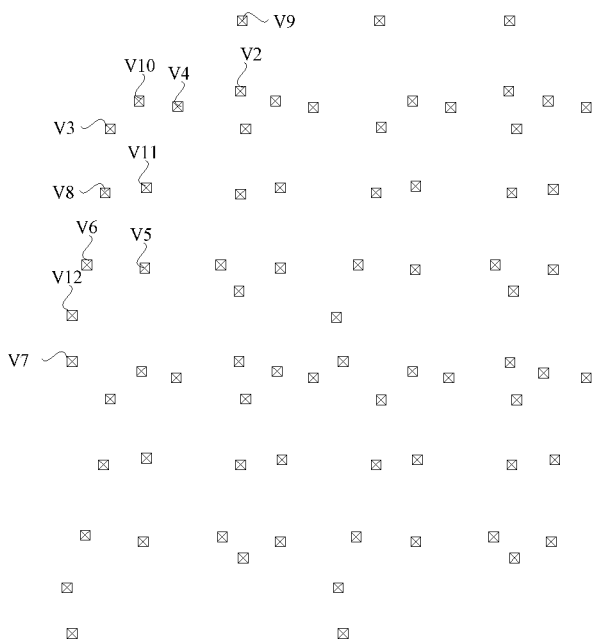
FIG. 10B is a schematic diagram II of a pattern of a third insulating layer of a pixel circuit provided in FIG. 3A.
Figure 10C:
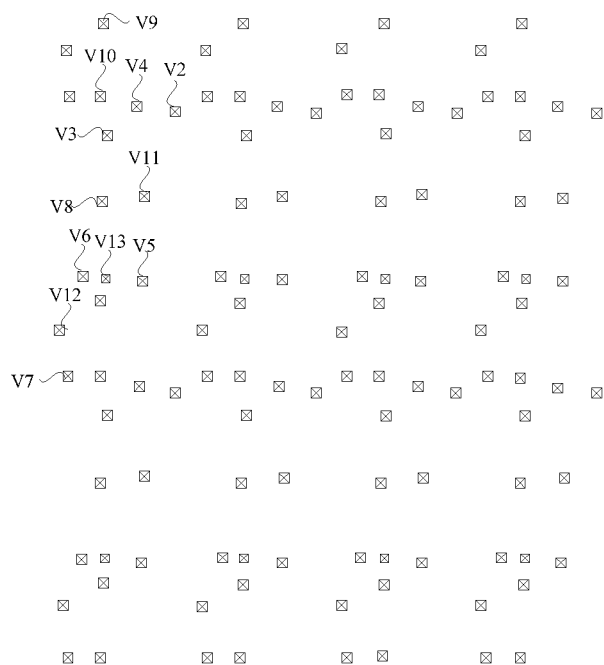
FIG. 10C is a schematic diagram of a pattern of a third insulating layer of a pixel circuit provided in FIG. 3B.

(4) Forming a third insulating layer pattern, which includes: depositing a third insulating film on the base substrate on which the aforementioned patterns are formed, patterning the third insulating film using a patterning process to form a third insulating layer pattern covering the aforementioned patterns, the third insulating layer is opened with a plurality of via patterns, as shown in FIGS. 10A to 10C and FIGS. 11A to 11C, FIG. 10A is a schematic diagram I of a pattern of a third insulating layer of a pixel circuit provided in FIG. 3A, FIG. 10B is a schematic diagram II of a pattern of a third insulating layer of a pixel circuit provided in FIG. 3A, FIG. 10C is a schematic diagram of a pattern of a third insulating layer of a pixel circuit provided in FIG. 3B, FIG.

Figure 11A:
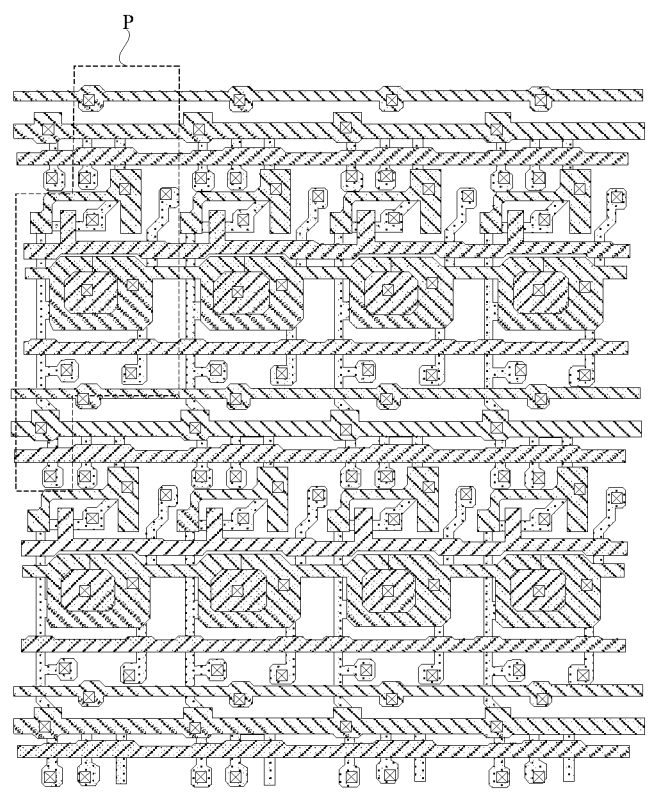
FIG. 11A is a schematic diagram I of a pixel circuit provided in FIG. 3A after a third insulating layer pattern is formed.
Figure 11B:
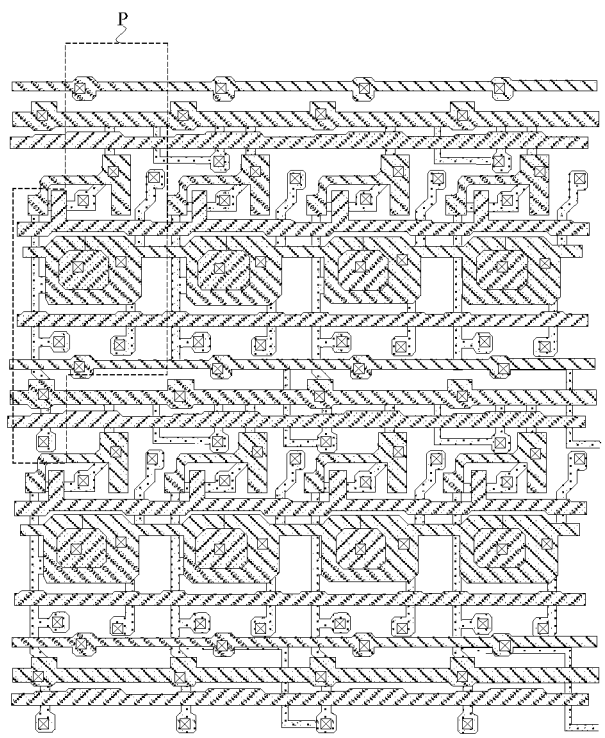
FIG. 11B is a schematic diagram II of a pixel circuit provided in FIG. 3A after a third insulating layer pattern is formed.
Figure 11C:
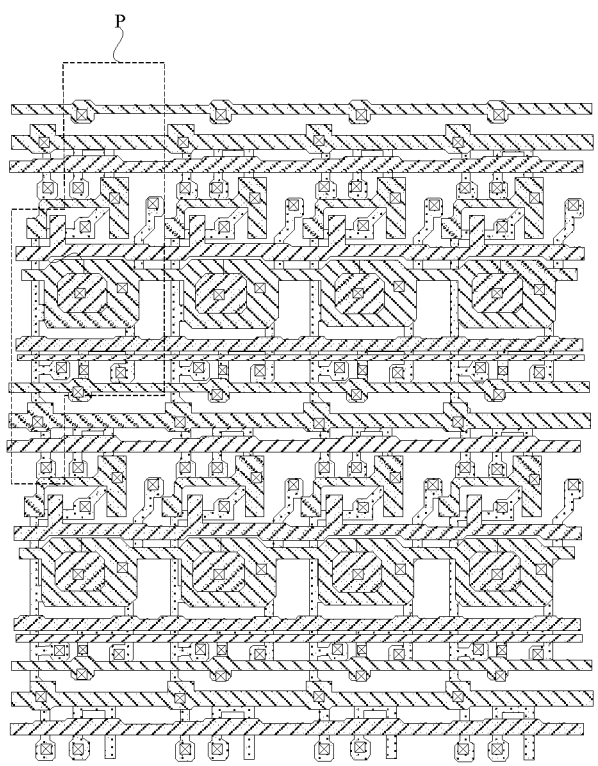
FIG. 11C is a schematic diagram of a pixel circuit provided in FIG. 3B after a third insulating layer pattern is formed.

11A is a schematic diagram I of a pixel circuit provided in FIG. 3A after a third insulating layer pattern is formed, FIG. 11B is a schematic diagram II of a pixel circuit provided in FIG. 3A after a third insulating layer pattern is formed, and FIG. 11C is a schematic diagram of a pixel circuit provided in FIG. 3B after a third insulating layer pattern is formed. FIG. 10A and FIG. 10B differ in that the semiconductor layers of adjacent pixel circuits are disposed at intervals in FIG. 10A, and the semiconductor layers of adjacent pixel circuits are connected to each other in FIG. 10B. FIG. 11A and FIG. 11B differ in that the semiconductor layers of adjacent pixel circuits are disposed at intervals in FIG. 11A, and the semiconductor layers of adjacent pixel circuits are connected to each other in FIG. 11B.

In an exemplary embodiment, as shown in FIG. 10A and FIG. 10B, the plurality of via patterns includes: a second via V2 to a seventh via V7 penetrating the first insulating layer, the second insulating layer, and the third insulating layer, an eighth via V8 penetrating the second insulating layer and the third insulating layer, and a ninth via V9 to a twelfth via V12 provided in the third insulating layer.

In an exemplary embodiment, as compared with FIG. 10A and FIG. 10B, the plurality of via patterns in FIG. 10C further includes: a thirteenth via V13 penetrating the first insulating layer, the second insulating layer, and the third insulating layer.

In an exemplary embodiment, the orthographic projection of the first via on the base substrate covers the orthographic projection of the eighth via V8 on the base substrate.

In an exemplary embodiment, the second via V2 exposes the active layer of the first transistor, the third via V3 exposes the active layer of the second transistor, the fourth via V4 exposes the active layer of the fourth transistor, the fifth via V5 exposes the active layer of the fifth transistor, the sixth via V6 exposes the active layer of the sixth transistor, the seventh via V7 exposes the active layer of the seventh transistor, the eighth via V8 exposes the first electrode plate of the capacitor, the ninth via V9 exposes the first initial signal line of the pixel circuit, the tenth via V10 exposes the shield electrode, the eleventh via V11 exposes the second electrode plate of the capacitor, the twelfth via V12 exposes the second initial signal line of the pixel circuit, and the thirteenth via V13 exposes the active layer of the eighth transistor.

The second vias of adjacent pixel circuits in FIG. 10A are different vias, and the seventh vias of adjacent pixel circuits are different vias, the second via of the pixel circuit in FIG. 10B and the second via of a first adjacent pixel circuit are a same via, and the seventh via of the pixel circuit and the seventh via of a second adjacent pixel circuit are a same via.

Figure 12A:
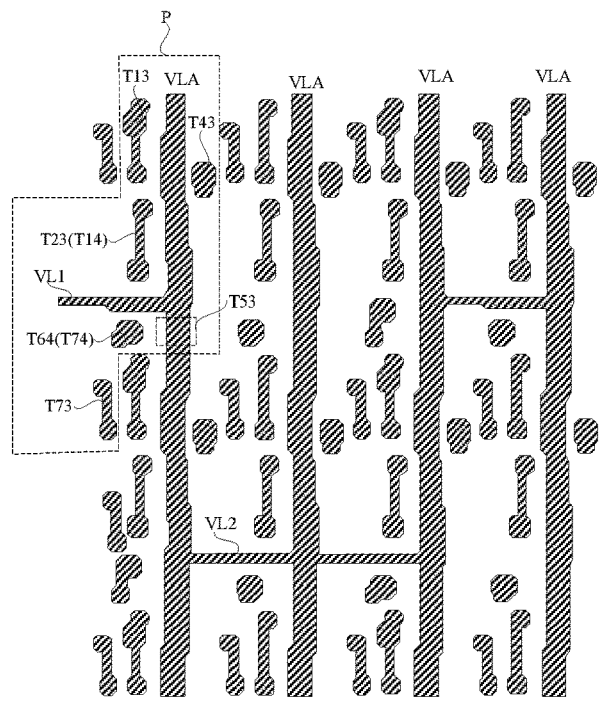
FIG. 12A is a schematic diagram I of a pattern of a first conductive layer of a pixel circuit provided in FIG. 3A.
Figure 12B:
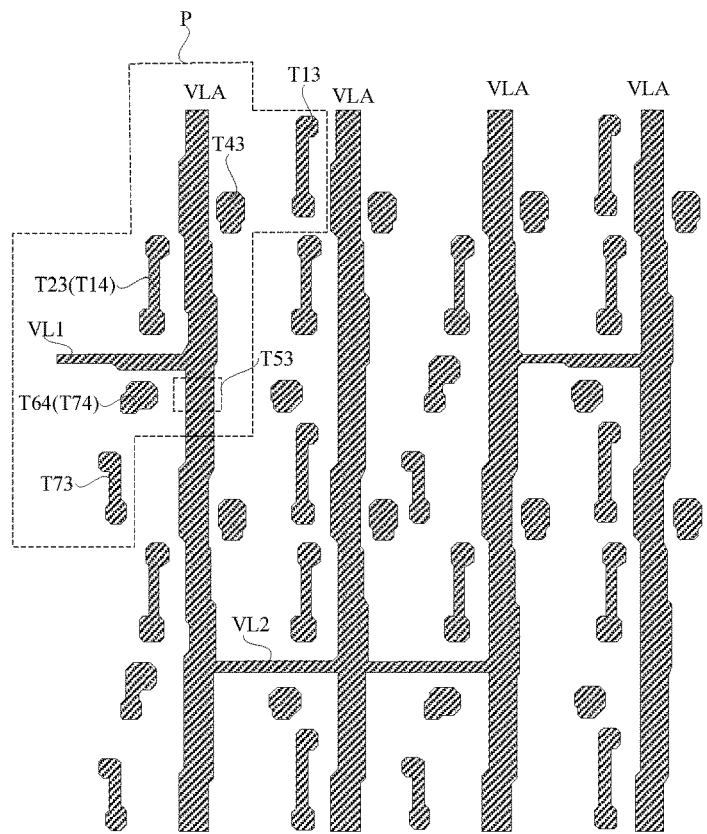
FIG. 12B is a schematic diagram II of a pattern of a first conductive layer of a pixel circuit provided in FIG. 3A.
Figure 12C:
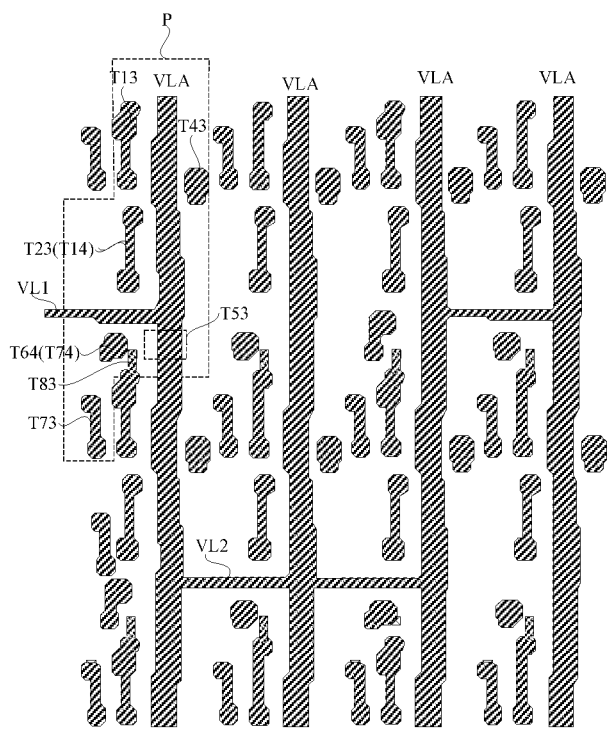
FIG. 12C is a schematic diagram of a pattern of a first conductive layer of a pixel circuit provided in FIG. 3B.
Figure 13A:
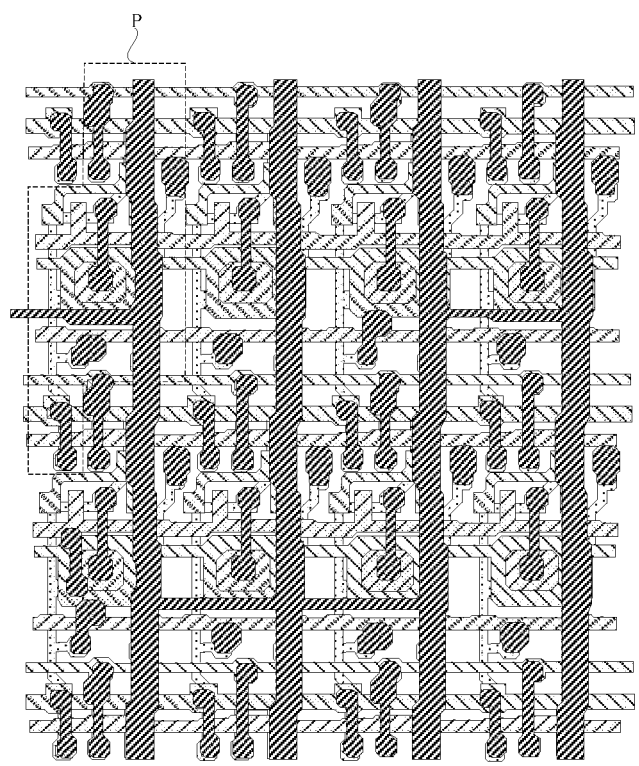
FIG. 13A is a schematic diagram I of a pixel circuit provided in FIG. 3A after a first conductive layer pattern is formed.
Figure 13B:
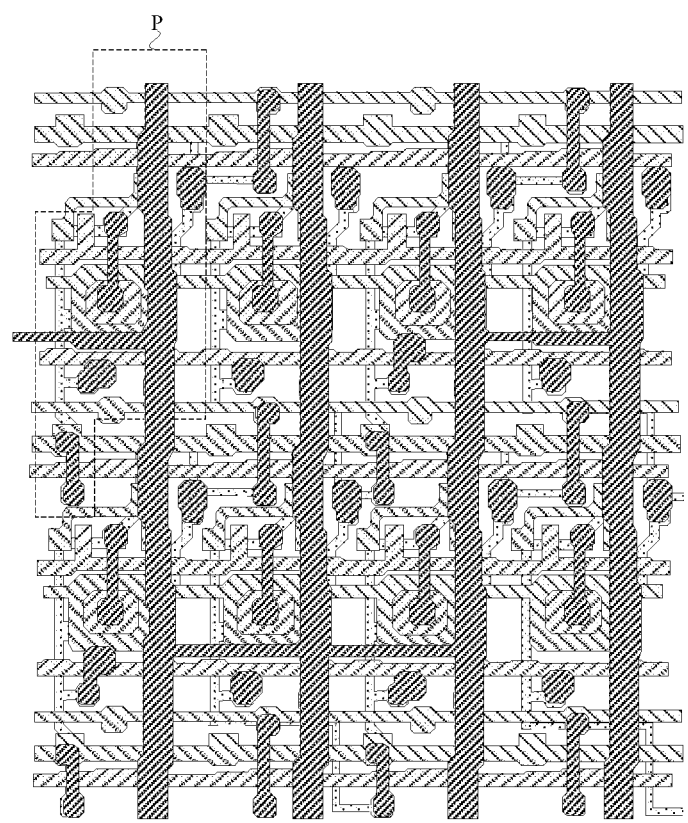
FIG. 13B is a schematic diagram II of a pixel circuit provided in FIG. 3A after a first conductive layer pattern is formed.
Figure 13C:
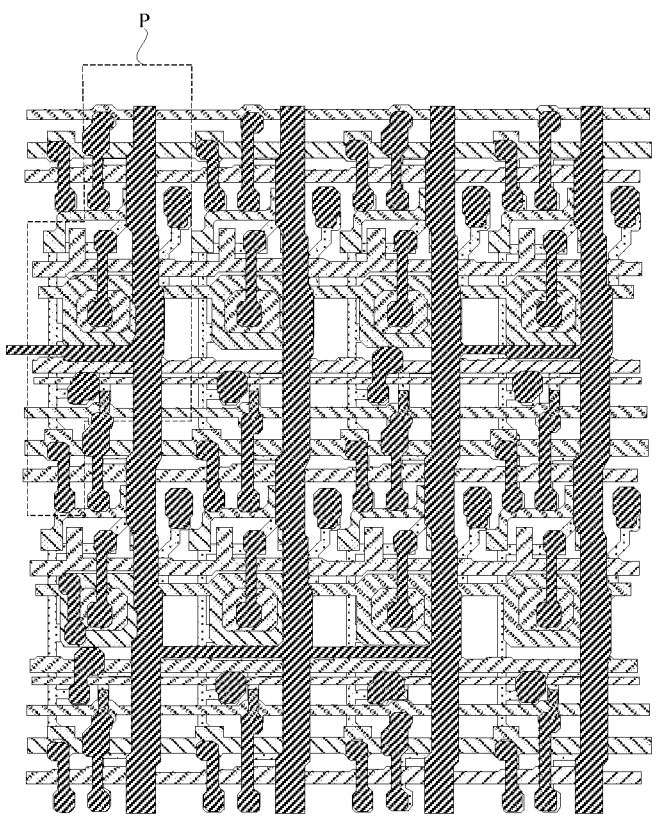
FIG. 13C is a schematic diagram of a pixel circuit provided in FIG. 3B after a first conductive layer pattern is formed.

(5) Forming a first conductive layer pattern, which includes: depositing a first conductive film on the base substrate on which the aforementioned patterns are formed, patterning the first conductive film using a patterning process to form a first conductive layer pattern, as shown in FIGS. 12A to 12C and 13A to 13C, FIG. 12A is a schematic diagram I of a pattern of a first conductive layer of a pixel circuit provided in FIG. 3A, FIG. 12B is a schematic diagram II of a pattern of a first conductive layer of a pixel circuit provided in FIG. 3A, FIG. 12C is a schematic diagram of a pattern of a first conductive layer of a pixel circuit provided in FIG. 3B, FIG. 13A is a schematic diagram I of a pixel circuit provided in FIG. 3A after a first conductive layer pattern is formed, FIG. 13B is a schematic diagram II of a pixel circuit provided in FIG. 3A after a first conductive layer pattern is formed, and FIG. 13C is a schematic diagram of a pixel circuit provided in FIG. 3B after a first conductive layer pattern is formed. FIG. 12A and FIG. 12B differ in that the semiconductor layers of adjacent pixel circuits are disposed at intervals in FIG. 12A, and the semiconductor layers of adjacent pixel circuits are connected to each other in FIG. 12B. FIG. 13A and FIG. 13B differ in that the semiconductor layers of adjacent pixel circuits are disposed at intervals in FIG. 13A, and the semiconductor layers of adjacent pixel circuits are connected to each other in FIG. 13B.

In an exemplary embodiment, as shown in FIG. 12A and FIG. 12B, the third conductive layer may include: the first power connection line VLA, the first electrode T13 and the second electrode T14 of the first transistor, the first electrode T23 of the second transistor, the first electrode T43 of the fourth transistor, the first electrode T53 of the fifth transistor, the second electrode T64 of the sixth transistor, the first electrode T73 and the second electrode T74 of the seventh transistor, the first power connection part VL1 and the second power connection part VL2.

In an exemplary embodiment, the first electrode T13 of the first transistor in the pixel circuit in FIG. 12A and the first electrode T13 of the first transistor in a first adjacent pixel circuit are different electrodes, the first electrode T73 of the seventh transistor in the pixel circuit and the first electrode T73 of the seventh transistor in a second adjacent pixel circuit are different electrodes, alternatively, the first electrode T13 of the first transistor in the pixel circuit in FIG. 12A and the first electrode T13 of the first transistor in a first adjacent pixel circuit are a same electrode, and the first electrode T73 of the seventh transistor in the pixel circuit and the first electrode T73 of the seventh transistor in a second adjacent pixel circuit are a same electrode.

In an exemplary embodiment, as compared with FIG. 12A and FIG. 12B, the third conductive layer in FIG. 12C may further include: a first electrode T83 of the eighth transistor.

In an exemplary embodiment, the first electrode T13 and the second electrode T14 of the first transistor, the first electrode T23 of the second transistor, the first electrode T53 of the fifth transistor, the second electrode T64 of the sixth transistor, the first electrode T73 and the second electrode T74 of the seventh transistor are located on a side of the first power connection line VLA of the pixel circuit close to the first power connection line of a previous column of pixel circuits, and the first electrode T43 of the fourth transistor is located on a side of the first power connection line VLA of the pixel circuit close to the first power connection line VLA of a next column of the pixel circuit.

In an exemplary embodiment, the second electrode T14 of the first transistor and the first electrode T23 of the second transistor are integrally formed, the second electrode T64 of the sixth transistor and the second electrode T74 of the seventh transistor are integrally formed, and the first electrode T53 of the fifth transistor and the first power connection line VLA are integrally formed. The first electrode of the eighth transistor and the first electrodes of the first transistors of a next row of pixel circuits are integrally formed.

In an exemplary embodiment, the first electrode T13 of the first transistor, the first electrode T23 of the second transistor, the first electrode T73 of the seventh transistor, and the first electrode T83 of the eighth transistor all extend in a first direction.

In an exemplary embodiment, the first power connection part VL1 extends in a second direction and the second power connection part VL2 extends in the second direction.

In an exemplary embodiment, for the first pixel circuit, the first electrode T13 and the second electrode T14 of the first transistor and the first electrode T23 of the second transistor are disposed on a first side of the first power connection part VL1, and the second electrode T64 of the sixth transistor and the first electrode T73 and the second electrode T74 of the seventh transistor are disposed on a second side of the first power connection part VL1.

In an exemplary embodiment, for the fourth pixel circuit, the first electrode T13 and the second electrode T14 of the first transistor and the first electrode T23 of the second transistor are disposed on a first side of the second power connection part VL2, and the second electrode T64 of the sixth transistor and the first electrode T73 and the second electrode T74 of the seventh transistor are disposed on a second side of the second power connection part VL2.

In an exemplary embodiment, for the first pixel circuit, the orthographic projection of the first power connection part VL1 on the base substrate at least partially overlaps the orthographic projection of the second electrode plate of the capacitor on the base substrate.

In an exemplary embodiment, for the fourth pixel circuit, the orthographic projection of the second power connection part VL2 on the base substrate at least partially overlaps the orthographic projection of the second electrode plate of the capacitor on the base substrate.

In an exemplary embodiment, the first electrode T13 of the first transistor is connected to the active layer of the first transistor via a second via and is connected to the first initial signal line of the pixel circuit via a ninth via, the first electrode T23 of the second transistor is connected to the active layer of the second transistor via a third via and is electrically connected to the first electrode plate via an eighth via, the first electrode T43 of the fourth transistor is connected to the active layer of the fourth transistor through a fourth via, the first power connection line of the pixel circuit is connected to the active layer of the fifth transistor through a fifth via, is electrically connected to the shield electrode through a tenth via, and is connected to the second electrode plate through a eleventh via, the second electrode T64 of the sixth transistor is connected to the active layer of the sixth transistor through a sixth via, and the first electrode T73 of the seventh transistor is connected to the active layer of the seventh transistor through a seventh via and is connected to the second initial signal line of the pixel circuit through a twelfth via, and the first electrode T83 of the eighth transistor is connected to the active layer of the eighth transistor through a thirteenth via.

Figure 14A:
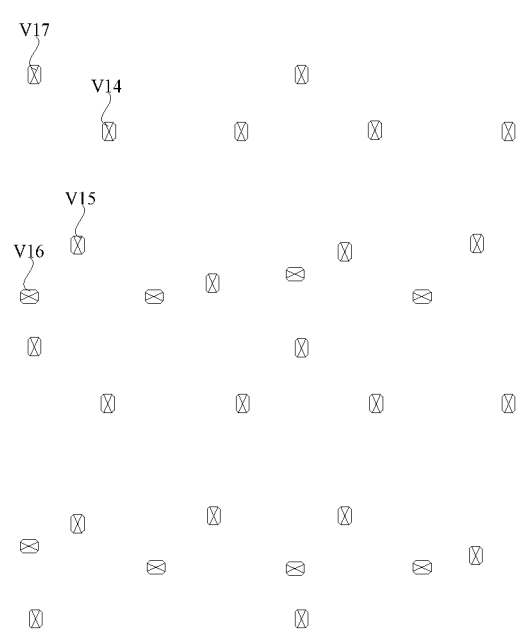
FIG. 14A is a schematic diagram of a pattern of a fourth insulating layer of a pixel circuit provided in FIGS. 3A and 3B.
Figure 14B:
FIG. 14B is another schematic diagram of a pattern of a fourth insulating layer of a pixel circuit provided in FIG. 3A.
Figure 15A:
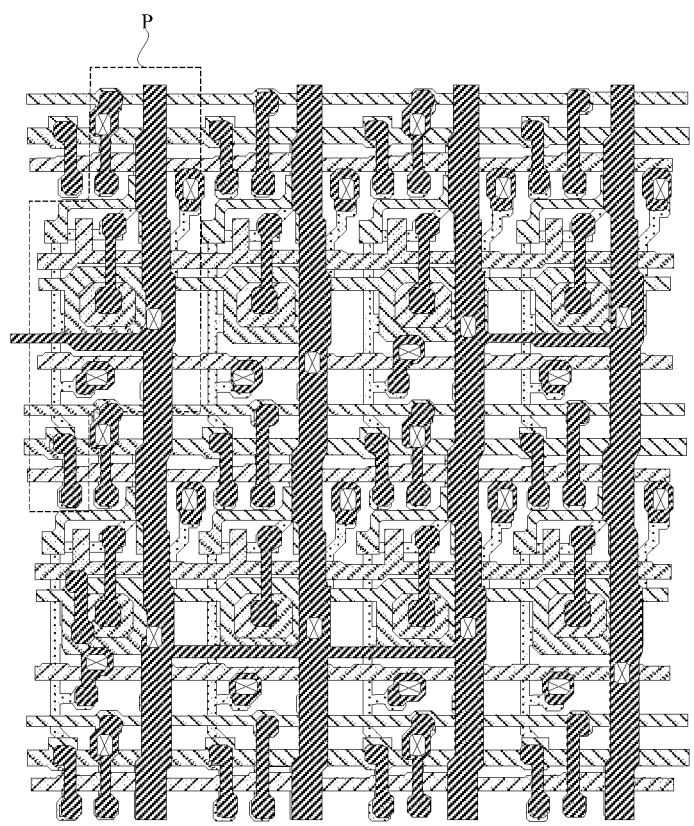
FIG. 15A is a schematic diagram I of a pixel circuit provided in FIG. 3A after a fourth insulating layer pattern is formed.
Figure 15B:
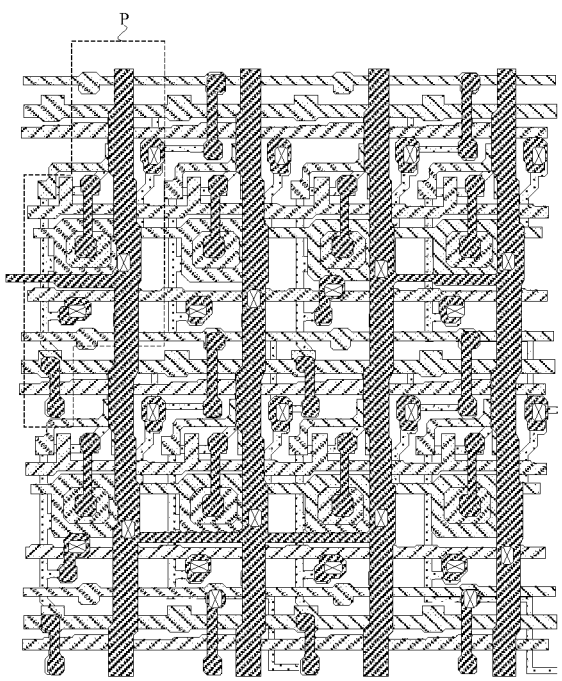
FIG. 15B is a schematic diagram II of a pixel circuit provided in FIG. 3A after a fourth insulating layer pattern is formed.
Figure 15C:
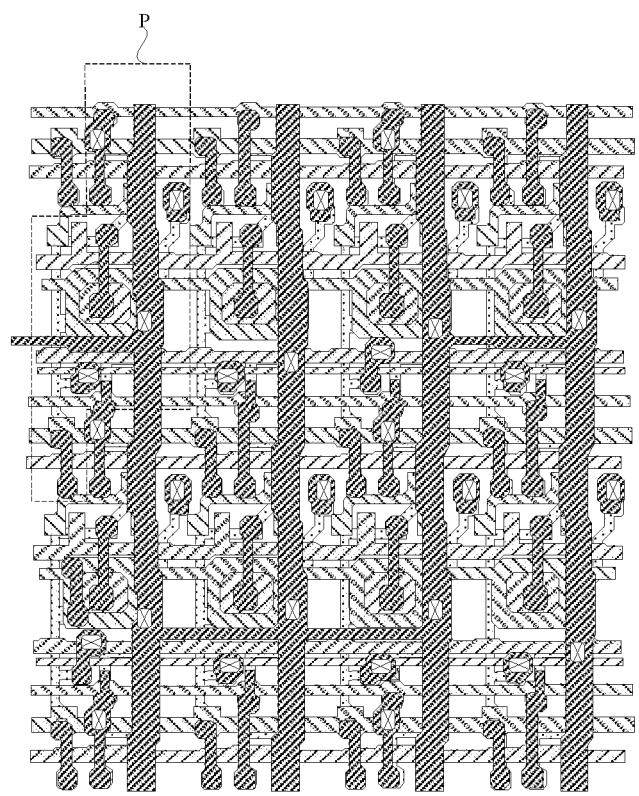
FIG. 15C is a schematic diagram of a pixel circuit provided in FIG. 3B after a fourth insulating layer pattern is formed.

(6) Forming a fourth insulating layer pattern, which includes: depositing a fourth insulating film on the base substrate on which the aforementioned patterns are formed, patterning the fourth insulating film using a patterning process to form a fourth insulating layer pattern covering the aforementioned patterns, the fourth insulating layer is opened with a plurality of via patterns, as shown in FIGS. 14A to 14B and FIGS. 15A to 15C, FIG. 14A is a schematic diagram of a pattern of a fourth insulating layer of a pixel circuit provided in FIGS. 3A and 3B, FIG. 14B is another schematic diagram of a pattern of a fourth insulating layer of a pixel circuit provided in FIG. 3A, FIG. 15A is a schematic diagram I of a pixel circuit provided in FIG. 3A after a fourth insulating layer pattern is formed, FIG. 15B is a schematic diagram II of a pixel circuit provided in FIG. 3A after a fourth insulating layer pattern is formed, and FIG. 15C is a schematic diagram of a pixel circuit provided in FIG. 3B after a fourth insulating layer pattern is formed. FIG. 14A and FIG. 14B differ in that the semiconductor layers of adjacent pixel circuits are disposed at intervals in FIG. 14A, and the semiconductor layers of adjacent pixel circuits are connected to each other in FIG. 14B. FIG. 15A and FIG. 15B differ in that the semiconductor layers of adjacent pixel circuits are disposed at intervals in FIG. 15A, and the semiconductor layers of adjacent pixel circuits are connected to each other in FIG. 15B.

In an exemplary embodiment, as shown in FIG. 14A and FIG. 14B, the plurality of via patterns includes a fourteenth via V14 to a sixteenth via V16 located in at least one pixel circuit and penetrating the fourth insulating layer.

In an exemplary embodiment, as shown in FIG. 14A, the plurality of via patterns further includes: a seventeenth via V17 penetrating the fourth insulating layer.

In an exemplary embodiment, the fourteenth via V14 exposes the first electrode of the fourth transistor, the fifteenth via V1 exposes the first power connection line, the sixteenth via V16 exposes the second electrode of the sixth transistor, and the seventeenth via B17 exposes the first electrode of the first transistor of the first pixel circuit and the second pixel circuit.

Figure 16A:
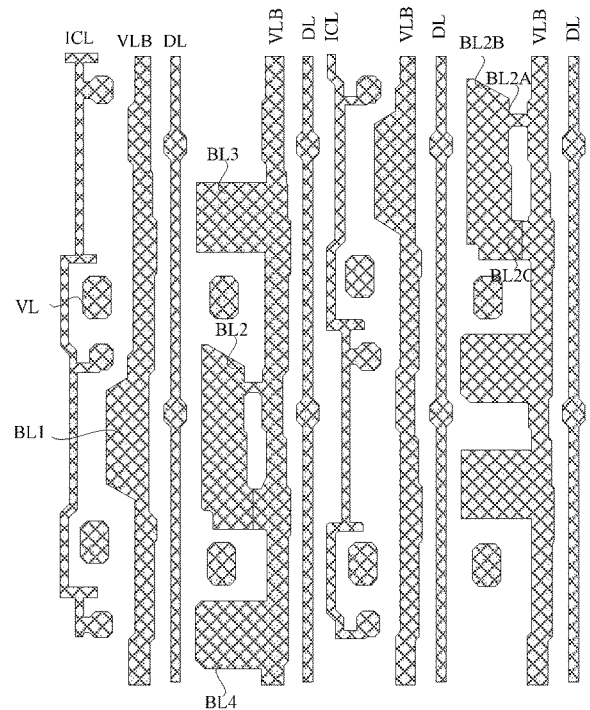
FIG. 16A is a schematic diagram of a pattern of a second conductive layer of a pixel circuit provided in FIGS. 3A and 3B.
Figure 16B:
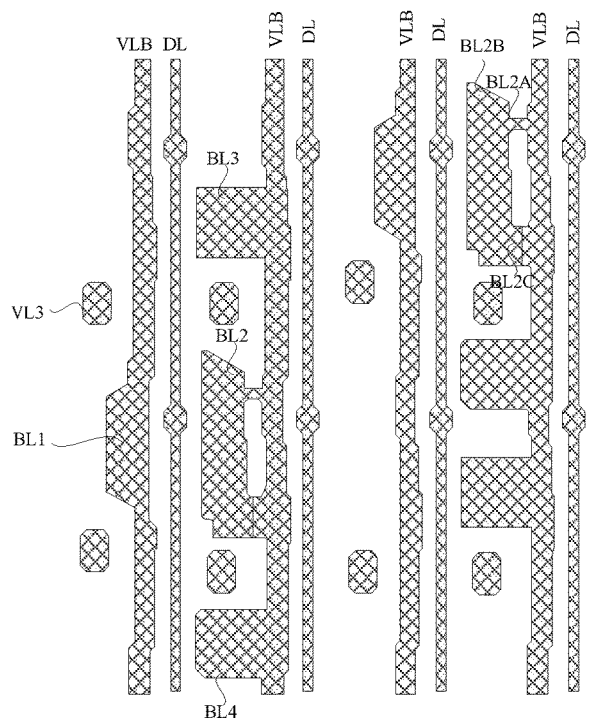
FIG. 16B is another schematic diagram of a pattern of a second conductive layer of a pixel circuit provided in FIG. 3A.
Figure 17A:
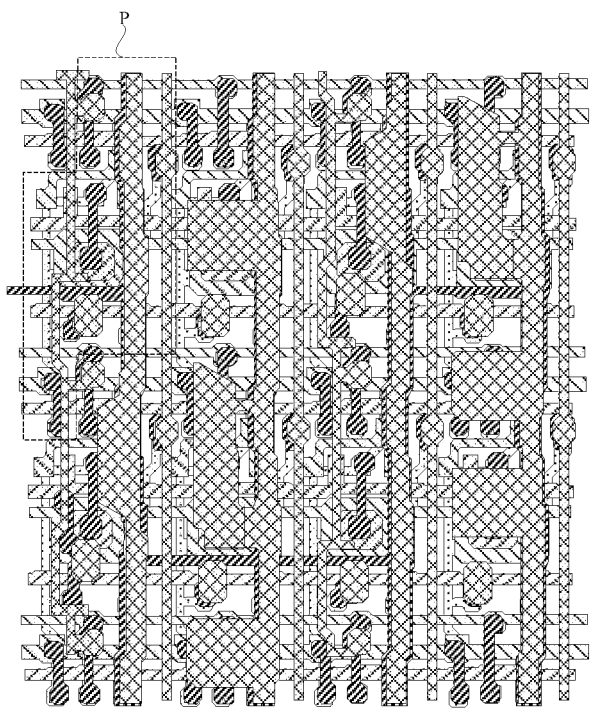
FIG. 17A is a schematic diagram I of a pixel circuit provided in FIG. 3A after a second conductive layer pattern is formed.
Figure 17B:
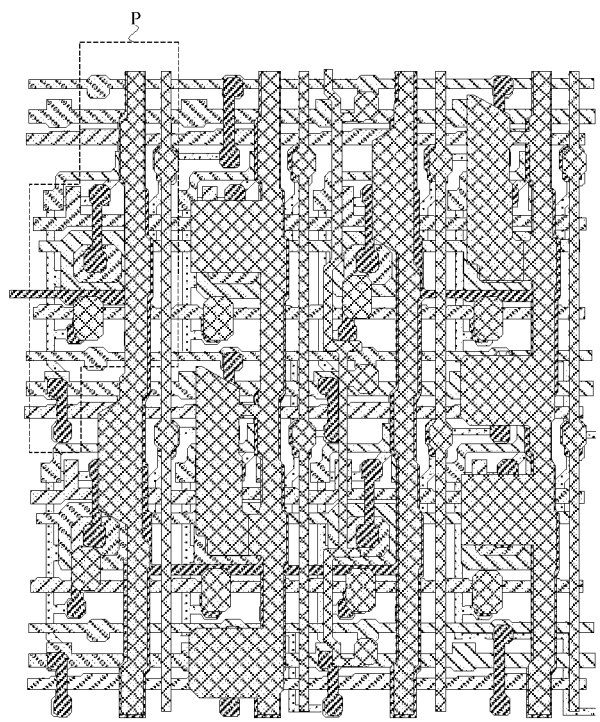
FIG. 17B is a schematic diagram II of a pixel circuit provided in FIG. 3A after a second conductive layer pattern is formed.
Figure 17C:
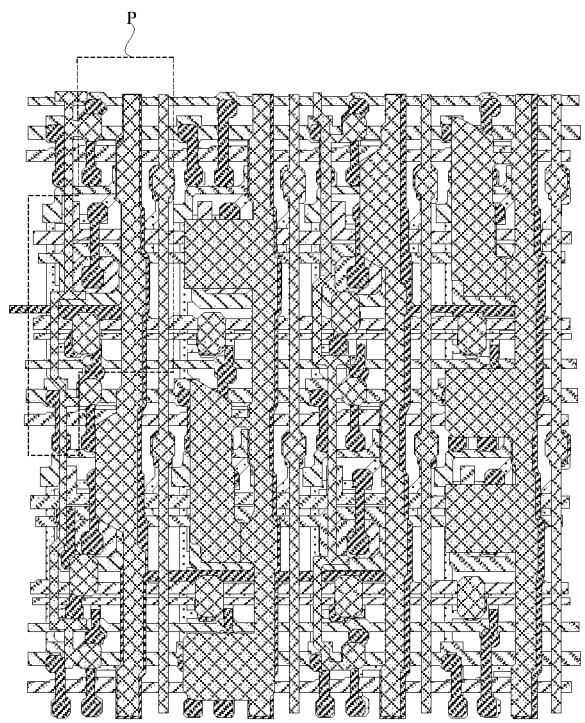
FIG. 17C is a schematic diagram of a pixel circuit provided in FIG. 3B after a second conductive layer pattern is formed.
Figure 18:
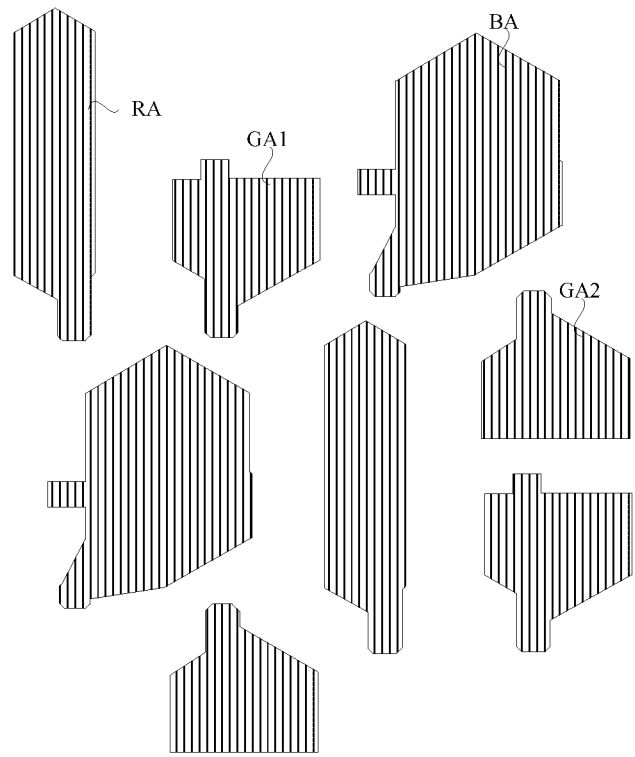
FIG. 18 is a schematic diagram of an anode layer pattern.

(7) Forming a second conductive layer pattern, which includes: depositing a second conductive film on the base substrate on which the aforementioned patterns are formed, patterning the second conductive film using a patterning process to form the second conductive layer pattern, as shown in FIGS. 16A to 16B and FIGS. 17A to 17C, FIG. 16A is a schematic diagram of a pattern of a second conductive layer of a pixel circuit provided in FIGS. 3A and 3B, FIG. 16B is another schematic diagram of a pattern of a second conductive layer of a pixel circuit provided in FIG. 3A, FIG. 17A is a schematic diagram I of a pixel circuit provided in FIG. 3A after a second conductive layer pattern is formed, FIG. 17B is a schematic diagram II of a pixel circuit provided in FIG. 3A after a second conductive layer pattern is formed, FIG. 17C is a schematic diagram of a pixel circuit provided in FIG. 3B after a second conductive layer pattern is formed. FIG. 16A and FIG. 16B differ in that the semiconductor layers of adjacent pixel circuits are disposed at intervals in FIG. 16A, and the semiconductor layers of adjacent pixel circuits are connected to each other in FIG. 16B. FIG. 17A and FIG. 17B differ in that the semiconductor layers of adjacent pixel circuits are disposed at intervals in FIG. 17A, and the semiconductor layers of adjacent pixel circuits are connected to each other in FIG. 17B.

In an exemplary embodiment, as shown in FIG. 16A and FIG. 16B, the fourth conductive layer may include: a plurality of second power connection lines VLB, a plurality of data signal lines DL, a connection electrode VL, a first electrode block BL1, a second electrode block BL2, a third electrode block BL3, and a fourth electrode block BL4.

In an exemplary embodiment, as compared with FIG. 16A and FIG. 16B, the fourth conductive layer further includes: a plurality of reset connection lines ICL.

In an exemplary embodiment, the reset connection lines ICL are located on a side of the second power connection line VLB of the pixel circuit away from the data signal line DL.

In an exemplary embodiment, the reset connection line ICL extends in a first direction and the plurality of reset connection lines ICL are arranged in a second direction.

In an exemplary embodiment, the reset connection line ICL may include: a T-shaped structure, wherein the T-shaped structure serves to level up the anode of the first light emitting element.

In an exemplary embodiment, the connection electrode VL is located on a side of the second power connection line VLB away from the data signal line DL.

In an exemplary embodiment, the shape of the connection electrode VL may be square.

In an exemplary embodiment, the data signal line DL of a pixel circuit is located between the second power connection line VLB of the pixel circuit and the second power connection line VLB of an adjacent pixel circuit.

In an exemplary embodiment, the data signal line DL is connected to the first electrode of the fourth transistor through the fourteenth via, the second power connection line VLB is connected to the first power connection line through the fifteenth via, the connection electrode VL is connected to the second electrode of the sixth transistor through the sixteenth via, and the reset connection line is connected to the first electrodes of the first transistors of the first pixel circuit and the second pixel circuit through the seventeenth via.

In an exemplary embodiment, the minimum distance between the second power connection line VLB of the pixel circuit and the data signal line DL is greater than or equal to 4 micron. The setting of the minimum distance between the second power connection line VLB of the pixel circuit and the data signal line DL can reduce the risk of short circuit between the power signal of the power supply line and the data signal of the data signal line in the manufacturing process for the display substrate, and can improve the reliability of the display substrate.

In an exemplary embodiment, the second electrode block located in the fourth pixel circuit forms a closed loop with the second power connection line of the fourth pixel circuit. The formation of the closed loop between the second electrode block BL2 of the fourth pixel circuit and the second power connection line can enlarge the area of the display substrate that is free of metal occlusion, improve the light transmission ratio of the display substrate, and improve the optical fingerprint recognition capability.

In an exemplary embodiment, as shown in FIG. 16A and FIG. 16B, the second electrode block BL2 may include: a first electrode connection part BL2A, a second electrode connection part BL2B, and a third electrode connection part BL2C. Herein, the first electrode connection part BL2A extends in a second direction and is connected to the second power connection line connected to the fourth pixel circuit and the second electrode connection part BL2B; the second electrode connection part BL2B extends in a first direction and is connected to the third electrode connection part BL2C; the third electrode connection part BL2C extends in the second direction and is connected to the second power connection line.

In an exemplary embodiment, the arrangement of the first electrode block BL1 and the second electrode block BL2 can ensure the flatness of the anode of the second light emitting element and can improve the display effect of the display substrate. In an exemplary embodiment, for the second pixel circuit, the orthographic projection of the first electrode block BL1 on the base substrate partially overlaps the orthographic projections of the shield electrode, the gate electrode of the second transistor, and the second electrode plate of the capacitor on the base substrate.

In an exemplary embodiment, for the fourth pixel circuit, the orthographic projection of the second electrode block BL2 on the base substrate at least partially overlaps the orthographic projections of the first electrode of the first transistor, the shield electrode, the gate electrode of the second transistor, and the gate electrode of the third transistor on the base substrate. The orthographic projection of the second electrode block on the base substrate partially overlaps the orthographic projections of the gate electrode of the second transistor and the gate electrode of the third transistor on the base substrate, so that the interference of an external electric field on the second transistor and the third transistor can be shielded, and the reliability of the display substrate can be improved.

In an exemplary embodiment, the arrangement of the third electrode block BL3 can ensure the flatness of the anode of the third light emitting element and can improve the display effect of the display substrate.

In an exemplary embodiment, the shape of the third electrode block BL3 may be square.

In an exemplary embodiment, for the third pixel circuit, the orthographic projection of the third electrode block BL3 on the base substrate partially overlaps the orthographic projections of the gate electrode of the second transistor and the gate electrode of the third transistor on the base substrate. Herein, the orthographic projection of the third electrode block BL3 on the base substrate partially overlaps the orthographic projection of the gate electrode of the third transistor on the base substrate, so that the interference of an external electric field on the third transistor can be shielded.

In an exemplary embodiment, the arrangement of the fourth electrode block BL4 can ensure the flatness of the anode of the fourth light emitting element and can improve the display effect of the display substrate.

In an exemplary embodiment, the shape of the fourth electrode block BL4 may be square.

In an exemplary embodiment, for the fourth pixel circuit, the orthographic projection of the fourth electrode block BL4 on the base substrate partially overlaps the orthographic projections of the gate electrode and the first electrode of the seventh transistor on the base substrate.

In an exemplary embodiment, the second electrode connection part BL2B serves to level up the right side of the anode of the second light emitting element.

In an exemplary embodiment, because the orthographic projection of the third electrode block on the base substrate covers the gate electrode of the driver transistor of the third pixel circuit, therefore the orthographic projection of the third electrode connection part BL3C on the base substrate covers the gate electrode of the driver transistor of the fourth pixel circuit, which can maintain the display uniformity of the third light emitting element and the fourth light emitting element.

Figure 19A:
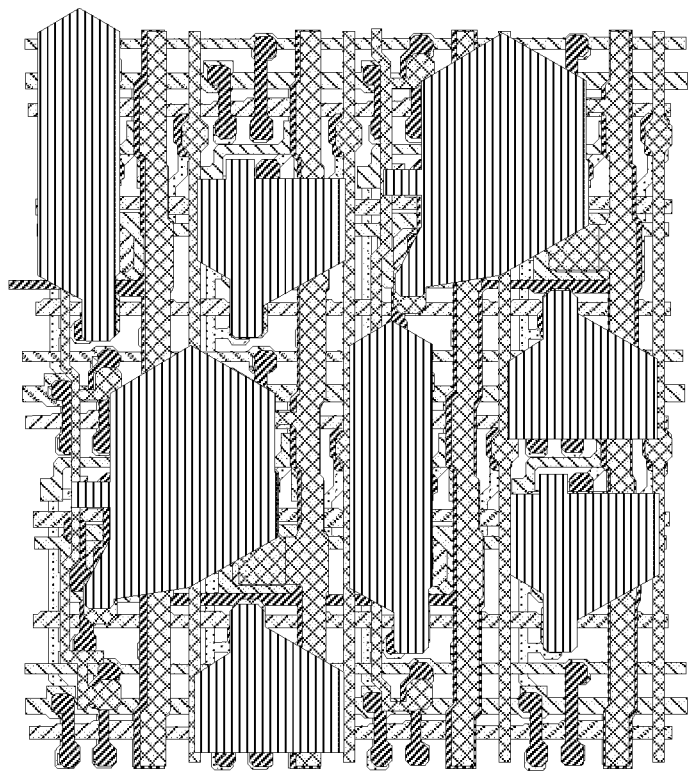
FIG. 19A is a schematic diagram I after an anode layer pattern is formed.
Figure 19B:
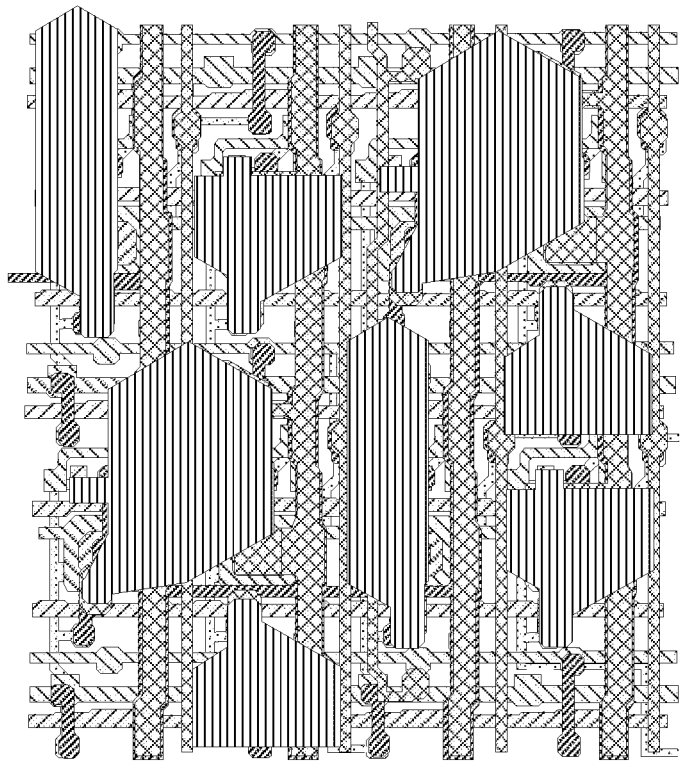
FIG. 19B is a schematic diagram II after an anode layer pattern is formed.
Figure 19C:
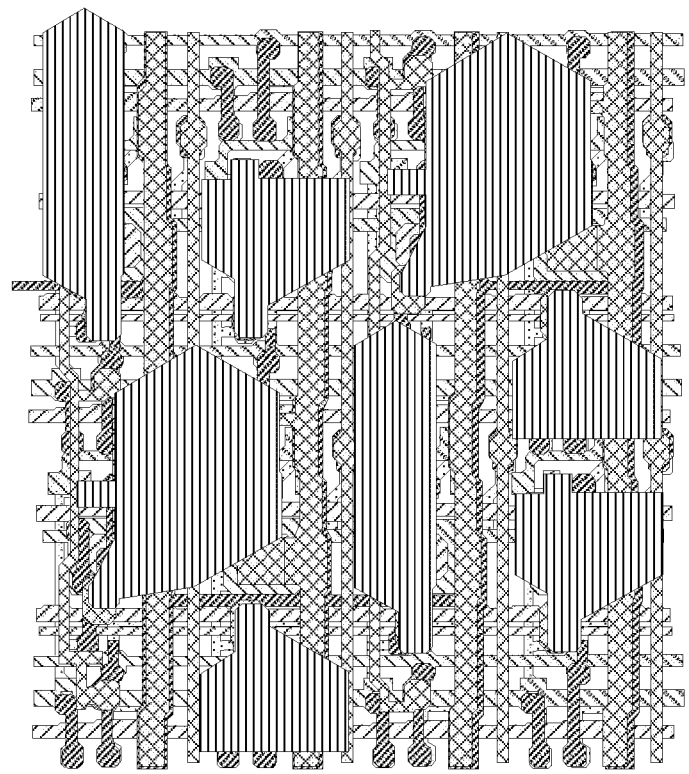
FIG. 19C is a schematic diagram III after an anode layer pattern is formed.
Figure 20:
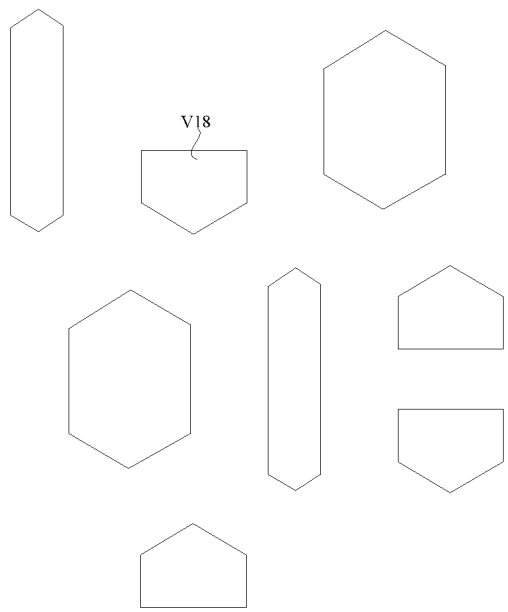
FIG. 20 is a schematic diagram of a pixel definition layer pattern.

(8) Forming an anode layer, which includes: coating a planarization film on the base substrate on which the aforementioned patterns are formed, patterning the planarization film to form a planarization layer pattern, depositing a transparent conductive film on the base substrate on which the aforementioned patterns are formed, patterning the transparent conductive film using a patterning process to form an anode layer pattern, as shown in FIG. 18 and FIGS. 19A to 19C, FIG. 18 is a schematic diagram of an anode layer pattern, FIG. 19A is a schematic diagram I after an anode layer pattern is formed, FIG. 19B is a schematic diagram II after an anode layer pattern is formed, and FIG. 19C is a schematic diagram III after an anode layer pattern is formed. FIG. 19A and FIG. 19B differ in that the semiconductor layers of adjacent pixel circuits are disposed at intervals in FIG. 19A, and the semiconductor layers of adjacent pixel circuits are connected to each other in FIG. 19B. FIG. 19A to FIG. 19C differ in that the pixel circuits in FIGS. 19A and 19B are the pixel circuits provided in FIG. 3A, and the pixel circuits in FIG. 19C are the pixel circuits provided in FIG. 3B.

In an exemplary embodiment, the anode layer may include: the anode RA of the first light emitting element, the anode BA of the second light emitting element, the anode GA1 of the third light emitting element, and the anode GA2 of the fourth light emitting element.

In an exemplary embodiment, the reset connection line is located at the midline position of the anode body part of the first light emitting element.

In an exemplary embodiment, the data signal line is located at the midline position of the anode body part of the second light emitting element.

In an exemplary embodiment, an orthographic projection of the anode connection part of the first light emitting element on the base substrate is at least partially overlapped with the orthographic projection of the connection electrode of the first pixel circuit on the base substrate, and the anode connection part of the first light emitting element is connected to a third connection electrode of the first pixel circuit.

In an exemplary embodiment, an orthographic projection of the anode connection part of the second light emitting element on the base substrate is at least partially overlapped with the orthographic projection of the connection electrode of the second pixel circuit on the base substrate, and the anode connection part of the second light emitting element is connected to the connection electrode of the second pixel circuit.

In an exemplary embodiment, the orthographic projection of the anode body part of the second light emitting element on the base substrate at least partially overlaps the orthographic projections of the first electrode block located in the second pixel circuit and the second electrode block in the fourth pixel circuit on the base substrate.

In an exemplary embodiment, the distance between the boundary of the anode body part of the second light emitting element and the boundary of the first electrode block covered by the anode body part of the second light emitting element is greater than or equal to 0.5 micron and less than or equal to 1 micron.

In an exemplary embodiment, the distance between the boundary of the anode of the second light emitting element and the boundary of the second electrode connection part of the second electrode block covered by the anode body part of the second light emitting element is greater than or equal to 0.5 micron and less than or equal to 1 micron.

In an exemplary embodiment, the orthographic projection of the anode body part of the third light emitting element on the base substrate covers the orthographic projection of the third electrode block located in the third pixel circuit on the base substrate.

In an exemplary embodiment, the orthographic projection of the anode body part of the third light emitting element on the base substrate partially overlaps the orthographic projection of the second power connection line on the base substrate.

In an exemplary embodiment, the distance between the boundary of the anode body part of the third light emitting element and the boundary of the third electrode block covered by the anode body part of the third light emitting element is greater than or equal to 0.5 micron and less than or equal to 1 micron.

In an exemplary embodiment, an orthographic projection of the anode connection part of the third light emitting element on the base substrate at least partially overlaps the orthographic projection of the connection electrode of the third pixel circuit on the base substrate, and the anode connection part of the third light emitting element is connected to the connection electrode of the third pixel circuit.

In an exemplary embodiment, the orthographic projection of the anode body part of the fourth light emitting element on the base substrate covers the orthographic projection of the fourth electrode block located in the fourth pixel circuit on the base substrate.

In an exemplary embodiment, the orthographic projection of the anode body part of the fourth light emitting element on the base substrate partially overlaps the orthographic projection of the second power connection line on the base substrate.

In an exemplary embodiment, an orthographic projection of the anode connection part of the fourth light emitting element on the base substrate at least partially overlaps the orthographic projection of the connection electrode of the fourth pixel circuit on the base substrate, and the anode connection part of the fourth light emitting element is connected to the connection electrode of the fourth pixel circuit.

In an exemplary embodiment, the distance between the boundary of the anode body part of the fourth light emitting element and the boundary of the fourth electrode block covered by the anode body part of the fourth light emitting element is greater than or equal to 0.5 micron and less than or equal to 1 micron.

Figure 21A:
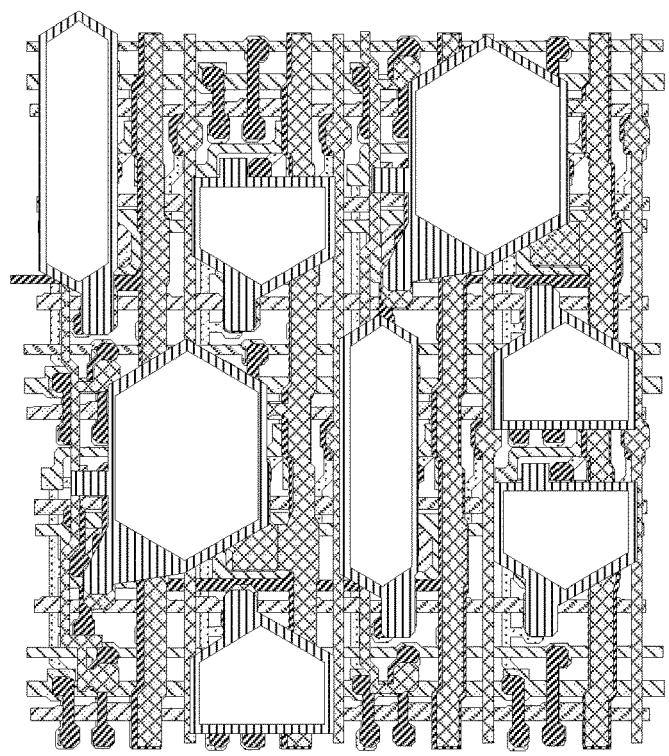
FIG. 21A is a schematic diagram I after a pixel definition layer pattern is formed.
Figure 21B:
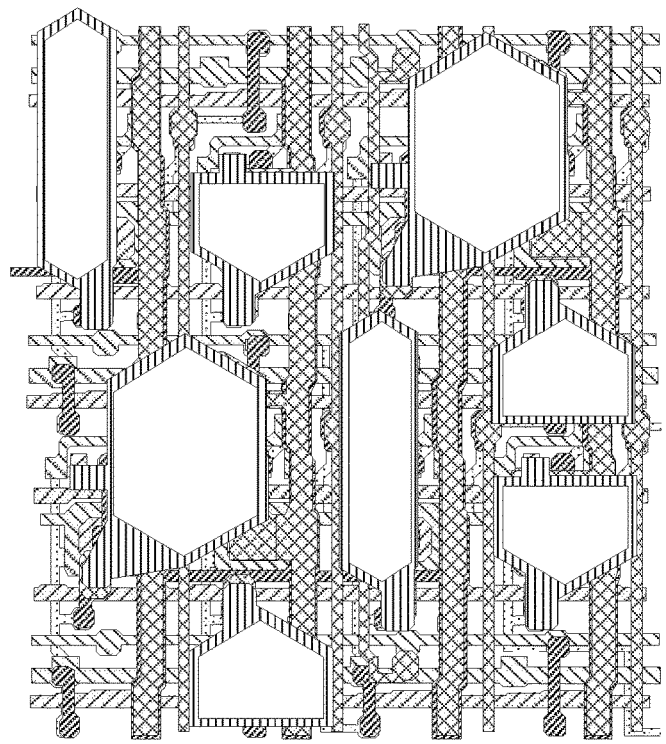
FIG. 21B is a schematic diagram II after a pixel definition layer pattern is formed.
Figure 21C:
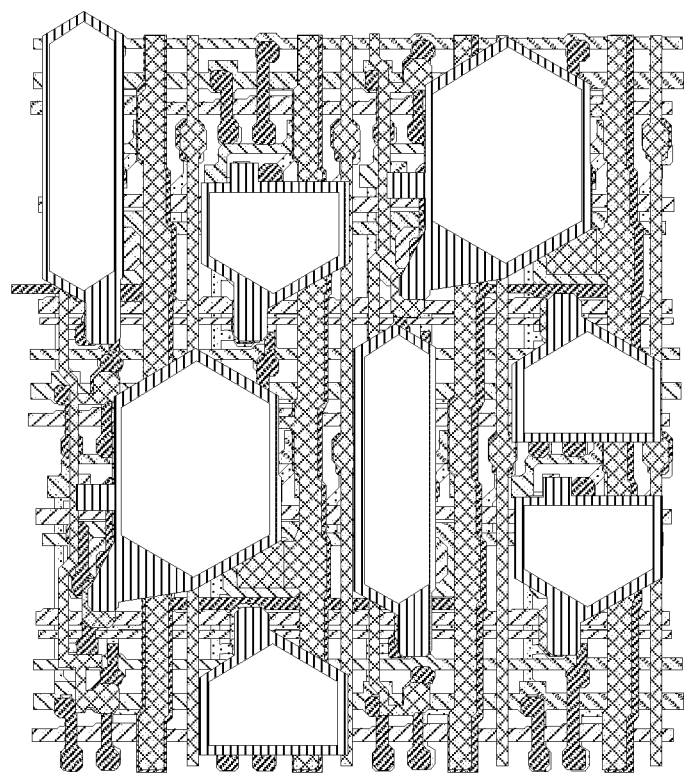
FIG. 21C is a schematic diagram III after a pixel definition layer pattern is formed.

(9) Forming a pixel definition layer, which includes: depositing a pixel definition film on the base substrate on which the aforementioned patterns are formed, patterning the pixel definition film using a patterning process to form a pixel definition layer pattern exposing the anode of the light emitting element, as shown in FIG. 20 and FIGS. 21A to 21C, FIG. 20 is a schematic diagram of a pixel definition layer pattern, FIG. 21A is a schematic diagram I after a pixel definition layer pattern is formed, FIG. 21B is a schematic diagram II after a pixel definition layer pattern is formed, FIG. 21C is a schematic diagram III after a pixel definition layer pattern is formed. FIG. 21A and FIG. 21B differ in that the semiconductor layers of adjacent pixel circuits are disposed at intervals in FIG. 21A, and the semiconductor layers of adjacent pixel circuits are connected to each other in FIG. 21B. FIGS. 21A to 21C differ in that the pixel circuits in FIGS. 21A and 21B are the pixel circuits provided in FIG. 3A, and the pixel circuits in FIG. 21C are the pixel circuits provided in FIG. 3B.

In an exemplary embodiment, the pixel definition layer may include: an eighteenth via V18 that exposes the anode of the light emitting element.

(10) Forming an organic material layer and a cathode layer, which includes: coating an organic light emitting material on the base substrate on which the aforementioned patterns are formed, patterning the organic light emitting material using a patterning process to form an organic material layer pattern, depositing a sixth conductive film on the base substrate on which the organic material layer pattern is formed, and patterning the sixth conductive film using a patterning process to form the cathode layer.

In an exemplary embodiment, the organic material layer may include: an organic light emitting layer of a light emitting element.

In an exemplary embodiment, the cathode layer may include: a cathode of a light emitting element.

In an exemplary embodiment, the semiconductor layer may be an amorphous silicon layer, a polycrystalline silicon layer, or may be a metal oxide layer. Herein, the metal oxide layer may use an oxide including indium and tin, an oxide including tungsten and indium, an oxide including tungsten, indium and zinc, an oxide including titanium and indium, an oxide including titanium, indium and tin, an oxide including indium and zinc, an oxide including silicon, indium and tin, or an oxide including indium or gallium and zinc. The metal oxide layer may be a monolayer, or may be a bilayer, or may be a multilayer.

In an exemplary embodiment, the first conductive layer may be made of a metal material, such as any one or more of argentum (Ag), copper (Cu), aluminum (Al), and molybdenum (Mo), or alloy materials of the above conductive materials, such as an Aluminum Neodymium alloy (AlNd) or a Molybdenum Niobium alloy (MoNb), and may be of a single-layer structure or a multi-layer composite structure, such as Mo/Cu/Mo. Exemplarily, a manufacturing material of the first conductive layer can include: molybdenum.

In an exemplary embodiment, the second conductive layer may be made of a metal material, such as any one or more of argentum (Ag), copper (Cu), aluminum (Al), and molybdenum (Mo), or alloy materials of the above conductive materials, such as an Aluminum Neodymium alloy (AlNd) or a Molybdenum Niobium alloy (MoNb), and may be of a single-layer structure or a multi-layer composite structure, such as Mo/Cu/Mo. Exemplarily, a manufacturing material of the second conductive layer may include: molybdenum.

In an exemplary embodiment, the third conductive layer may be made of a metal material, such as any one or more of argentum (Ag), copper (Cu), aluminum (Al), and molybdenum (Mo), or alloy materials of the above conductive materials, such as an Aluminum Neodymium alloy (AlNd) or a Molybdenum Niobium alloy (MoNb), and may be of a single-layer structure or a multi-layer composite structure, such as Mo/Cu/Mo. Exemplarily, the third conductive layer may be of a three-layer stacked structure formed of titanium, aluminum, and titanium.

In an exemplary embodiment, the fourth conductive layer may be made of a metal material, such as any one or more of argentum (Ag), copper (Cu), aluminum (Al), and molybdenum (Mo), or alloy materials of the above conductive materials, such as an Aluminum Neodymium alloy (AlNd) or a Molybdenum Niobium alloy (MoNb), and may be of a single-layer structure or a multi-layer composite structure, such as Mo/Cu/Mo. Exemplarily, the fourth conductive layer may be of a three-layer stacked structure formed of titanium, aluminum, and titanium.

In an exemplary embodiment, the anode layer may be made of a transparent conductive material, such as any one or more of indium gallium zinc oxide (a-IGZO), zinc nitride oxide (ZnON), and indium zinc tin oxide (IZTO).

In an exemplary embodiment, the cathode layer may be made of a metal material, such as any one or more of argentum (Ag), copper (Cu), aluminum (Al), and molybdenum (Mo), or alloy materials of the above conductive materials, such as an Aluminum Neodymium alloy (AlNd) or a Molybdenum Niobium alloy (MoNb), and may be of a single-layer structure or a multi-layer composite structure, such as Mo/Cu/Mo. Exemplarily, the fourth conductive layer may be of a three-layer stacked structure formed of titanium, aluminum, and titanium.

In an exemplary embodiment, the first insulating layer, the second insulating layer, the third insulating layer, and the fourth insulating layer may be made of any one or more of Silicon Oxide (SiOx), Silicon Nitride (SiNx), and Silicon Oxynitride (SiON), and may be a single layer, a multi-layer, or a composite layer. The first insulating layer can be called a first gate insulating layer, the second insulating layer can be called a second gate insulating layer, and the third insulating layer can be called an interlayer dielectric layer.

In an exemplary embodiment, the planarization layer may be made of an organic material.

The display substrate according to the embodiment of the present disclosure may be applied to display products with any resolution.

An embodiment of the present disclosure further provides a display apparatus, which may include: a display substrate.

The display substrate is the display substrate according to any of the aforementioned embodiments, and has similar implementation principles and implementation effects, which will not be repeated here.

In an exemplary embodiment, the display apparatus may be a Liquid Crystal Display (LCD for short) or an Organic Light Emitting Diode (OLED for short) display apparatus. The display apparatus may be any product or component with a display function, such as a liquid crystal panel, electronic paper, an OLED panel, an Active-Matrix Organic Light Emitting Diode (AMOLED for short) panel, a mobile phone, a tablet computer, a television, a display, a notebook computer, a digital photo frame, or a navigator.

The accompanying drawings of the present disclosure only involve the structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, the element may be "directly" located "on" or "under" the other element, or there may be an intermediate element.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a base substrate and a drive structure layer disposed on the base substrate, wherein: the drive structure layer comprises pixel circuits arranged in an array, each pixel circuit of the pixel circuits arranged in the array comprise a plurality of power supply lines configured to provide power supply signals; the pixel circuit further comprises a capacitor, the capacitor comprises a first electrode plate and a second electrode plate disposed on a side of the first electrode plate away from the base substrate;

the plurality of power supply lines comprise a plurality of
first power connection lines located in a first conductive layer and a plurality of second power connection lines located in a second conductive layer, the second conductive layer is located on a side of the first conductive layer away from the base substrate, the first power connection lines and the second power connection lines extend in a first direction, the plurality of first power connection lines and the plurality of second power connection lines are arranged in a second direction, the first direction and the second direction are intersected;
two adjacent first power connection lines are connected by a connection part located at the first conductive layer, and an orthographic projection of the connection part on the base substrate is at least partially overlapped with an orthographic projection of the second electrode plate on the base substrate; and the display substrate further comprises a light emitting structure layer provided on a side of the drive structure layer away from the base substrate, wherein the light emitting structure layer comprises a plurality of light emitting elements; the light emitting elements are connected to the pixel circuits, at least one light emitting element comprises an anode, an organic light emitting layer and a cathode stacked sequentially on the drive structure layer; the anode of the light emitting element comprises an anode body part and an anode connection part, an orthographic projection of an effective light emitting region of the light emitting element on the base substrate is located inside an orthographic projection of a corresponding anode body part on the base substrate, and the anode connection part is connected to the pixel circuit and the anode body part, respectively.

2. The display substrate according to claim 1, wherein a first power connection line and a second power connection line of a same pixel circuit are connected, and an orthographic projection of the first power connection line on the base substrate covers an orthographic projection of the second power connection line on the base substrate.

3. The display substrate according to claim 1,
wherein the light emitting element comprises a first light emitting element, a second light emitting element, a third light emitting element and a fourth light emitting element; the first light emitting element emits red light, the second light emitting element emits blue light, the third light emitting element and the fourth light emitting element emit green light; and both of an anode body part of the first light emitting element and an anode body part of the second light emitting element have a hexagonal shape, an anode body part of the second light emitting element has an area larger than an area of the anode body part of the first light emitting element, both of an anode body part of the third light emitting element and an anode body part of the fourth light emitting element have a pentagonal shape, and the anode body part of the third light emitting element and the anode body part of the fourth light emitting element are symmetrical about a virtual straight line extending in the second direction.

4. The display substrate according to claim 3, wherein the pixel circuit comprises a first pixel circuit to a fourth pixel circuit, wherein the first pixel circuit is a pixel circuit connected to the first light emitting element, the second pixel circuit is a pixel circuit connected to the second light emitting element, the third pixel circuit is a pixel circuit connected to the third light emitting element, and the fourth pixel circuit is a pixel circuit connected to the fourth light emitting element, and the connection part comprises a first power connection part with an orthographic projection on the base substrate that is overlapped with an orthographic projection of a second electrode plate of the first pixel circuit on the base substrate, and a second power connection part with an orthographic projection on the base substrate that is overlapped with an orthographic projection of a second electrode plate of the fourth pixel circuit on the base substrate; the first power connection part and the second power connection part extend in the second direction, a virtual straight line extending in the second direction is passed through the first power connection part and the second power connection part respectively.

5. The display substrate according to claim 4, wherein the pixel circuit comprises a drive transistor; the drive structure layer further comprises a first electrode block located in the second pixel circuit; the first electrode block is located in the second conductive layer and connected to a second power connection line of the second pixel circuit, and for the second pixel circuit, an orthographic projection of the first electrode block on the base substrate is partially overlapped orthographic projections of a gate electrode of the drive transistor and the second electrode plate on the base substrate.

6. The display substrate according to claim 5, wherein the pixel circuit further comprises a first reset transistor and a compensation transistor; the drive structure layer further comprises a second electrode block located in the fourth pixel circuit, the second electrode block is located in the second conductive layer and connected to a second power connection line of the fourth pixel circuit, and for the fourth pixel circuit, an orthographic projection of the second electrode block on the base substrate is at least partially overlapped with orthographic projections of a first electrode of the first reset transistor, a gate electrode of the compensation transistor and the gate electrode of the drive transistor on the base substrate.

7. The display substrate according to claim 6, wherein a closed loop is formed between the second electrode block of the fourth pixel circuit and the second power connection line of the fourth pixel circuit, the second electrode block comprises a first electrode connection part, a second electrode connection part and a third electrode connection part, the first electrode connection part is extended in the second direction and is connected to the second power connection line of the fourth pixel circuit and to the second electrode connection part, the second electrode connection part is extended in the first direction and is connected to the third electrode connection part, and the third electrode connection part is extended in the second direction and is connected to the second power connection line of the fourth pixel circuit.

8. The display substrate according to claim 6, wherein the drive structure layer further comprises a third electrode block located in the third pixel circuit, the third electrode block is located in the second conductive layer and connected to a second power connection line of the third pixel circuit, and for the third pixel circuit, an orthographic projection of the third electrode block on the base substrate is partially overlapped with orthographic projections of the gate electrode of the compensation transistor and the gate electrode of the drive transistor on the base substrate.

9. The display substrate according to claim 8, wherein the pixel circuit further comprises a second reset transistor, the drive structure layer further comprises a fourth electrode block located in the fourth pixel circuit, the fourth electrode block is located in the second conductive layer and connected to the second power connection line of the fourth pixel circuit, and for the fourth pixel circuit, an orthographic projection of the fourth electrode block on the base substrate is partially overlapped with orthographic projections of a gate electrode and a first electrode of the second reset transistor on the base substrate.

10. The display substrate according to claim 9, wherein the pixel circuits arranged in an array further comprise a plurality of data lines located in the second conductive layer, the data lines are extended in the first direction, and an orthographic projection of the anode body part of the second light emitting element on the base substrate is at least partially overlapped with orthographic projections of the first electrode block located in the second pixel circuit and the second electrode block of the fourth pixel circuit on the base substrate; wherein the orthographic projection of the first electrode block on the base substrate is located on a side of a bisector of the anode body part of the second light emitting element extending in the first direction, the orthographic projection of the second electrode block on the base substrate is located on the other side of the bisector, an orthographic projection of a data line on the base substrate is partially overlapped with an orthographic projection of the bisector of the anode body part of the second light emitting element extending in the first direction on the base substrate.

11. The display substrate according to claim 10, wherein an orthographic projection of the anode body part of the third light emitting element on the base substrate covers the orthographic projection of the third electrode block located in the third pixel circuit on the base substrate, the orthographic projection of the anode body part of the third light emitting element on the base substrate is partially overlapped with the orthographic projection of the second power connection line on the base substrate; wherein the second power connection line of the third pixel circuit is located on a side of a bisector of the anode body part of the third light emitting element extending in the first direction.

12. The display substrate according to claim 10, wherein an orthographic projection of the anode body part of the fourth light emitting element on the base substrate covers the orthographic projection of the fourth electrode block located in the fourth pixel circuit on the base substrate, the orthographic projection of the anode body part of the fourth light emitting element on the base substrate is partially overlapped with the orthographic projection of the second power connection line on the base substrate; wherein the second power connection line of the fourth pixel circuit is located on a side of a bisector of the anode body part of the fourth light emitting element extending in the first direction.

13. The display substrate according to claim 10, wherein the orthographic projection of the anode body part of the second light emitting element on the base substrate is not overlapped with an orthographic projection of a hollow region on the base substrate, the hollow region is a region enclosed by the second electrode block and the second power connection line.

14. The display substrate according to claim 10, wherein a distance between a boundary of the anode body part of the second light emitting element and a boundary of the first electrode block covered by the anode body part of the second light emitting element is greater than or equal to 0.5 micron and less than or equal to 1 micron, and a distance between the boundary of the anode body part of the second light emitting element and a boundary of the second electrode connection part of the second electrode block covered by the anode body part of the second light emitting element is greater than or equal to 0.5 micron and less than or equal to 1 micron;

a distance between a boundary of the anode body part of the third light emitting element and a boundary of the third electrode block covered by the anode body part of the third light emitting element is greater than or equal to 0.5 micron and less than or equal to 1 micron, and a distance between a boundary of the anode body part of the fourth light emitting element and a boundary of the fourth electrode block covered by the anode body part of the fourth light emitting element is greater than or equal to 0.5 micron and less than or equal to 1 micron.

15. The display substrate according to claim 12, wherein the pixel circuits arranged in an array further comprise a plurality of reset signal lines, a plurality of scan signal lines, a plurality of light emitting signal lines, a plurality of first initial signal lines and a plurality of second initial signal lines; the reset signal lines, the scan signal lines and the light emitting signal lines are disposed in a same layer as the first electrode plate, the first initial signal lines and the second initial signal lines are disposed in a same layer as the second electrode plate, the plurality of reset signal lines, the plurality of scan signal lines, the plurality of light emitting signal lines, the plurality of first initial signal lines and the plurality of second initial signal lines extend in the second direction and are arranged in the first direction, and the pixel circuit comprises a first reset signal terminal, a second reset signal terminal, a first initial signal terminal, a second initial signal terminal, a scan signal terminal, a light emitting signal terminal and a data signal terminal, wherein the first reset signal terminal and the second reset signal terminal are electrically connected to different reset signal lines respectively, the scan signal terminal is electrically connected to a scan signal line, the light emitting signal terminal is electrically connected to a light emitting signal line, the first initial signal terminal is electrically connected to a first initial signal line, the second initial signal terminal is electrically connected to a second initial signal line, and the data signal terminal is electrically connected to a data signal line.

16. The display substrate according to claim 15, wherein the pixel circuit comprises a plurality of transistors, the drive structure layer comprises a semiconductor layer, a first insulating layer, a third conductive layer, a second insulating layer, a fourth conductive layer, a third insulating layer, a first conductive layer, a fourth insulating layer and a second conductive layer stacked sequentially on the base substrate, the semiconductor layer comprises active layers of the plurality of transistors located in at least one pixel circuit, the third conductive layer comprises the reset signal lines, the scan signal line, the light emitting signal line, the first electrode plate and gate electrodes of the plurality of transistors, the fourth conductive layer comprises the first initial signal line, the second initial signal line and the second electrode plate, the first conductive layer comprises the first power connection line, the first power connection part and the second power connection part, and the second conductive layer comprises the second power connection line, the data signal line, the first electrode block, the second electrode block, the third electrode block and the fourth electrode block.

17. The display substrate according to claim 16, wherein the pixel circuits arranged in an array further comprise a plurality of reset connection lines located in the second conductive layer, the reset connection lines are extended in the first direction, and the plurality of reset connection lines are arranged in the second direction, and the reset connection lines are electrically connected to the plurality of first initial signal lines through a connection block located in the first conductive layer; an orthographic projection of a reset connection line on the base substrate is at least partially overlapped with an orthographic projection of a bisector of the anode body part of the first light emitting element extending in the first direction on the base substrate.

18. The display substrate according to claim 16, wherein pixel circuits located on a same row as the pixel circuit and adjacent to the pixel circuit are a first adjacent pixel circuit and a second adjacent pixel circuit, respectively, the first electrode of the first reset transistor of the pixel circuit is connected to a first electrode of a first reset transistor of the first adjacent pixel circuit through the semiconductor layer, and the first electrode of the second reset transistor of the pixel circuit is connected to a first electrode of a second reset transistor of the second adjacent pixel circuit through the semiconductor layer, and the first initial signal line is connected with the pixel circuit and the first electrode of the first reset transistor of the first adjacent pixel circuit through a via hole, and the second initial signal line is connected with the pixel circuit and the first electrode of the second reset transistor of the second adjacent pixel circuit through a via hole.

19. The display substrate according to claim 16, wherein the reset signal line and the scan signal line of the pixel circuit are located on a same side of the first electrode plate of the pixel circuit, and the reset signal line is located on a side of the scan signal line away from the first electrode plate of the pixel circuit, and the light emitting signal line of the pixel circuit is located on a side of the first electrode plate of the pixel circuit away from the scan signal line, and the second initial signal line of the pixel circuit is located between a first initial signal line of a next row of pixel circuits and the second electrode plates of the next row of pixel circuits, and is located on a side of the second electrode plate of the pixel circuit away from the first initial signal line of the pixel circuit.

20. A display apparatus, comprising the display substrate according to claim 1.

* * * * *